United States Patent
Hirler et al.

(10) Patent No.: US 8,981,520 B2
(45) Date of Patent: Mar. 17, 2015

(54) SEMICONDUCTOR DEVICE WITH AN EDGE TERMINATION STRUCTURE

(71) Applicant: Infineon Technologies Austria AG, Villach (AT)

(72) Inventors: Franz Hirler, Isen (DE); Anton Mauder, Kolbermoor (DE); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/972,602

(22) Filed: Aug. 21, 2013

(65) Prior Publication Data

US 2013/0334653 A1    Dec. 19, 2013

Related U.S. Application Data

(62) Division of application No. 13/205,759, filed on Aug. 9, 2011, now Pat. No. 8,680,645.

(51) Int. Cl.
| | |
|---|---|
| *H01L 21/70* | (2006.01) |
| *H01L 29/06* | (2006.01) |
| *H01L 29/66* | (2006.01) |
| *H01L 29/868* | (2006.01) |
| *H01L 29/739* | (2006.01) |
| *H01L 21/761* | (2006.01) |
| *H01L 29/78* | (2006.01) |
| *H01L 29/861* | (2006.01) |
| *H01L 29/04* | (2006.01) |
| *H01L 29/40* | (2006.01) |

(52) U.S. Cl.
CPC ...... *H01L 29/0649* (2013.01); *H01L 29/66136* (2013.01); *H01L 29/868* (2013.01); *H01L 29/0692* (2013.01); *H01L 29/7397* (2013.01); *H01L 21/761* (2013.01); *H01L 29/66734* (2013.01); *H01L 29/7803* (2013.01); *H01L 29/7811* (2013.01); *H01L 29/7813* (2013.01); *H01L 29/0653* (2013.01); *H01L 29/0661* (2013.01); *H01L 29/0696* (2013.01); *H01L 29/8613* (2013.01); *H01L 29/045* (2013.01); *H01L 29/407* (2013.01)
USPC .......................................................... 257/506

(58) Field of Classification Search
CPC ........................................................ H01L 29/06
USPC ........................... 257/139, 520; 438/510, 525
See application file for complete search history.

(56) References Cited

U.S. PATENT DOCUMENTS

| | | |
|---|---|---|
| 5,828,602 A | 10/1998 | Wong |
| 7,196,397 B2 | 3/2007 | Chiola et al. |

(Continued)

FOREIGN PATENT DOCUMENTS

WO    2004001854 A2    12/2003

*Primary Examiner* — Vongsavanh Sengdara
*Assistant Examiner* — Ismail Muse
(74) *Attorney, Agent, or Firm* — Murphy, Bilak & Homiller, PLLC

(57) ABSTRACT

A semiconductor device having a semiconductor die and an edge termination structure is provided. The semiconductor die includes an outer edge and an active area defining a main horizontal surface and being spaced apart from the outer edge. The edge termination structure includes at least one vertical trench having an insulated side wall forming, in a horizontal cross-section, an acute angle with the outer edge. The acute angle is lower than about 20°.

7 Claims, 30 Drawing Sheets

(56) References Cited

U.S. PATENT DOCUMENTS

| | | |
|---|---|---|
| 7,829,972 B2 | 11/2010 | Hirler et al. |
| 2003/0032259 A1 | 2/2003 | Kirchhoff et al. |
| 2003/0047776 A1 | 3/2003 | Hueting et al. |
| 2004/0070002 A1 | 4/2004 | Kurosaki et al. |
| 2006/0118864 A1 | 6/2006 | Hirler et al. |
| 2006/0244104 A1 | 11/2006 | Ozeki et al. |
| 2007/0210410 A1* | 9/2007 | Hirler et al. .................. 257/520 |
| 2008/0265276 A1* | 10/2008 | Noda et al. .................. 257/139 |
| 2010/0230745 A1 | 9/2010 | Saito et al. |
| 2010/0273307 A1 | 10/2010 | Sedlmaier et al. |

* cited by examiner

SEMICONDUCTOR DEVICE WITH AN EDGE TERMINATION STRUCTURE

PRIORITY CLAIM

This application is a Divisional of U.S. application Ser. No. 13/205,759, filed on 9 Aug. 2011, the content of said application incorporated herein by reference in its entirety.

TECHNICAL FIELD

This specification refers to embodiments of semiconductor devices, in particular power semiconductor devices, having field redistributing structure. Furthermore, this specification refers to embodiments of manufacturing methods for such devices.

BACKGROUND

Many functions of modern devices in automotive, consumer and industrial applications, such as computer technology, mobile communications technology, converting electrical energy and driving an electric motor or an electric machine, rely on semiconductor devices, in particular semiconductor transistors such as field-effect transistors (FETs), for example MOSFETs (Metal Oxide Semiconductor Field-Effect Transistors) and IGBTs (Insulated-Gate Bipolar Transistors), and BJTs (Bipolar Junction Transistors).

It is often desirable that rectifying semiconductor devices such as diodes and IGBTs have a sufficiently high blocking capability. Accordingly, their rectifying pn-junction or pn-junctions are often desired to withstand sufficiently high reverse voltages. Unfavorable dimensioning may result in avalanche generation close to or at points where the rectifying pn-junctions come to or near a surface. Accordingly, blocking capability may be reduced to values well below the value of the bulk breakthrough field strength of the semiconductor material.

To reduce the intensity of the electric fields near the edge of a rectifying junction (e.g. pn-junction), high voltage semiconductor devices may include an edge termination structure in a peripheral area arranged around an active area with the rectifying junction. An edge termination structure provides a transition region in which the high electric fields around the active area change gradually to the lower potential at the edge of the device. The edge termination structure may, for example, lower the field intensity around the termination region of the rectifying junction by spreading the electric field lines across the termination region.

Planar edge-termination structures such as field plates, guard-ring structures or channel stop region are arranged on or close to a main horizontal surface of the semiconductor device. Often a combination of several edge-termination structures is used. To achieve high blocking capability and stability, a comparatively large peripheral area is typically required when planar edge-termination structures are used. Furthermore, the size of the peripheral area typically rises with rated blocking voltage. For example, for a rated blocking voltage of 600 V one or more field-plates are used with a horizontal extension of the resulting edge-termination system of at least about 150 μm is typically required. For a rated blocking voltage of about 6.5 kV the horizontal extension of the edge-termination system using field plates is typically larger than about 2 mm. Accordingly, the fraction of the active area used for switching and/or controlling the load current is significantly reduced, and thus the costs per chip or die increased. Furthermore, forming these structures is often associated with increased processing requirements.

Different thereto, vertical edge-termination structures, also known as mesa edge-termination structures, typically require less space. For example, a circumferential vertical trench filled with an insulating or a semi-insulating material may be used as edge-termination structure. However, for higher rated blocking voltages of 600 V or more, the desired horizontal width of a circumferential vertical trench filled with an insulating material is comparatively large. This may cause high mechanical stress. Furthermore, charges trapped in the insulating material may, in particular for bipolar semiconductor devices, result in increased switching losses. Depositing semi-insulating materials on vertical sidewalls of the circumferential vertical trench is, on the other hand, associated with increased processing requirements.

For these and other reasons there is a need for the embodiments disclosed in the present application.

SUMMARY

According to an embodiment, a semiconductor device having a semiconductor die is provided. The semiconductor die includes a main horizontal surface, an outer edge, an active area, and a peripheral area. The peripheral area includes a dielectric structure surrounding the active area and extending from the main horizontal surface into the semiconductor die. The dielectric structure includes, in a horizontal cross-section, at least one substantially L-shaped portion that is inclined against the outer edge.

According to an embodiment, a semiconductor device having a semiconductor die is provided. The semiconductor die includes an outer edge and an active area. The active area defines a main horizontal surface and is spaced apart from the outer edge. The semiconductor die further includes an edge termination structure having at least one vertical trench. The at least one vertical trench has an insulated side wall that forms, in a horizontal cross-section, an acute angle with the outer edge which is lower than about 20°.

According to an embodiment, a semiconductor device having a semiconductor die is provided. The semiconductor die includes an outer edge and an active area. The active area defines a main horizontal surface and is spaced apart from the outer edge. The semiconductor die further includes an edge termination structure having at least one vertical trench. The at least one vertical trench at least partially surrounds, in a horizontal cross-section, the active area from at least two sides and has an insulated side wall forming, in the horizontal cross-section, an acute angle with the outer edge.

According to an embodiment, a semiconductor device having a semiconductor die is provided. The semiconductor die includes an outer edge and an active area which defines a main horizontal surface and is spaced apart from the outer edge. The semiconductor die further includes an edge termination structure having a closed vertical trench surrounding the active area. The edge termination structure further includes at least one vertical trench which is, in a horizontal cross-section, arranged between the closed vertical trench and the active area. The at least one vertical trench includes an insulated side wall forming, in the horizontal cross-section, an acute angle with the outer edge.

According to an embodiment, a semiconductor device having a semiconductor die is provided. The semiconductor die includes a main horizontal surface which is surrounded by an outer edge, an active area, and a peripheral area. The peripheral area includes at least one vertical trench which at least partly surrounds the active area. The at least one vertical trench includes at least two portions which are, in a horizontal cross-section, arranged at an angle of about 90°. The at least two portions have respective insulated side walls which form, in the horizontal cross-section, an acute angle with the outer edge.

According to an embodiment, a method for forming a semiconductor device is provided. The method includes providing a semiconductor substrate having a main horizontal surface. A pn-junction is formed in the semiconductor substrate. Typically, a portion of the pn-junction extends to the main horizontal surface. A vertical trench is formed. The vertical trench extends from the main horizontal surface into the semiconductor substrate. A dielectric region is formed in the vertical trench so that the dielectric region at least partly surrounds the pn-junction from at least two sides in a horizontal cross-section.

According to an embodiment, a method for forming a semiconductor device is provided. The method includes providing a semiconductor substrate having a main horizontal surface. The method further includes defining an active area and a peripheral area. In the peripheral area a dielectric structure is formed such that the dielectric structure extends from the main horizontal surface into the semiconductor substrate, surrounds the active area, and includes, in a horizontal cross-section, at least one L-shaped portion.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of the embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
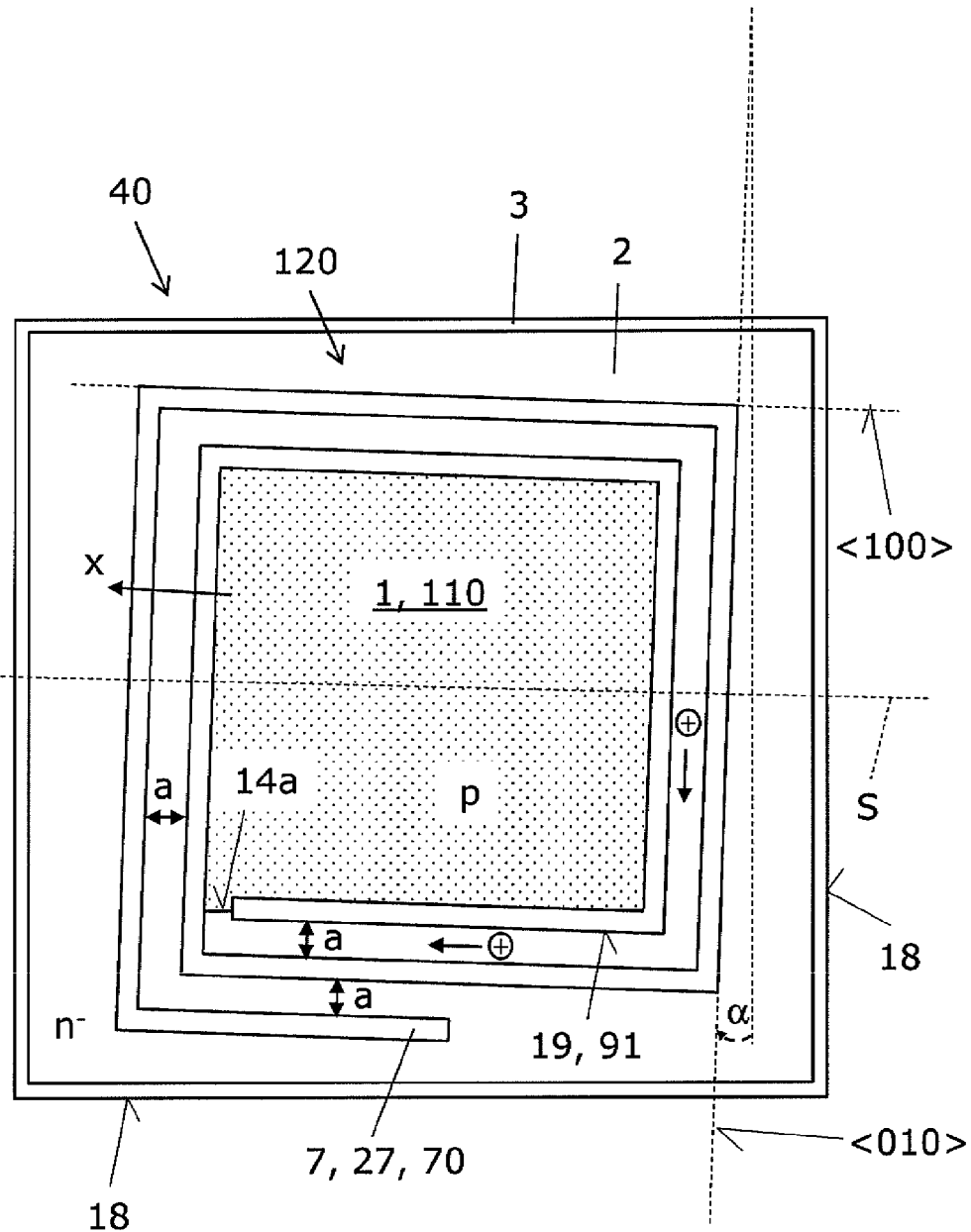
FIG. 1 schematically illustrates, in a plane view, a semiconductor device according to one or more embodiments.

In the following Detailed Description, reference is made to the accompanying drawings, which form a part hereof, and in which is shown by way of illustration specific embodiments that may be practiced. In this regard, spatially relative terms, such as "top", "bottom", "front", "back", "leading", "trailing", "under", "below", "lower", "over", "upper" etc., is used with reference to the orientation of the figure(s) being described. These terms are used for ease of description to explain the positioning of one element relative to a second element. Because components of embodiments can be positioned in a number of different orientations, the spatially relative terms are used for purposes of illustration and are in no way limiting. These terms are intended to encompass different orientations of the device in addition to different orientations than those depicted in the figures. Further, terms such as "first", "second", and the like, are also used to describe various elements, regions, sections, etc. and are also not intended to be limiting. It is to be understood that other embodiments may be utilized and structural or logical changes may be made without departing from the scope of the present application. The following detailed description, therefore, is not to be taken in a limiting sense, and the scope of the present application is defined by the appended claims.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Reference will now be made in detail to various embodiments, one or more examples of which are illustrated in the figures. Each example is provided by way of explanation, and is not meant as a limitation of the application. For example, features illustrated or described as part of one embodiment can be used on or in conjunction with other embodiments to yield yet a further embodiment. It is intended that the present application includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some figures illustrate relative doping concentrations by indicating "−" or "+" next to the doping type. For example, "n$^-$" means a doping concentration which is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

Specific embodiments described in this specification pertain to, without being limited thereto, semiconductor devices and manufacturing methods therefore, in particular to semiconductor devices having an active area and a peripheral area with an edge termination structure. The semiconductor devices are typically power semiconductor devices, for example vertical power semiconductor devices. The active area may include at least one diode and/or one or more transistors such as MOSFETs, IGBTs (Insulated-Gate Bipolar Transistors), JFETs (Junction-FETs) and BJTs (Bipolar Junction Transistors).

The term "power semiconductor device" as used in this specification intends to describe a semiconductor device on a single chip or die with high voltage and/or high current switching capabilities. In other words, power semiconductor devices are intended for high current, typically in the Ampere range, and/or voltages above 100 V, more typically above 200 V, even more typically, above 500 V.

In the context of the present specification, the term "in ohmic contact" intends to describe that there is an ohmic electric connection or ohmic current path between two regions, portion or parts of a semiconductor device through the semiconductor device or between different electrodes of one or more devices or between a electrode or a metallization and a portion or a part of the semiconductor device. In the context of the present specification, the terms "ohmic current path" and "resistive current path" are used synonymously. Further, the terms "ohmic contact" and "resistive contact" are used synonymously in the context of the present specification.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of a metal such as Al, Cu, W, Ti, Au, Ag, Ni, V, Sn and Co but may also be made of a material with metallic or near metallic properties with respect to electric conductivity such as highly doped n-type or p-type poly-Si, TiN or an electrically conductive silicide such as CoSi, TiSi or WSi$_2$ for example. The metallization may also include different electrically conductive materials, for example a stack of those materials.

In the following, embodiments pertaining to semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. Examples include but are not limited to elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaP), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe). The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (Si$_x$C$_{1-x}$) and silicon-SiGe heterojunction semiconductor materials. For power semiconductor applications currently mainly Si, SiC, GaAs and GaN materials are used. If the semiconductor body comprises a wide band-gap material such as SiC or GaN which has a high breakdown voltage and high critical avalanche field strength, respectively, the doping of the respective semiconductor regions can be chosen higher which reduces the on-resistance R$_{on}$. Furthermore, the leakage current across pn-junctions formed in wide band-gap materials is often negligible. The term "wide band-gap semiconductor material" as used in this specification intends to describe a semiconductor material with an electronic band-gap of about at least two electron volts (eV).

FIG. 1 is a schematic plane view on a semiconductor device 100. Semiconductor device 100 includes a semiconductor die or semiconductor chip 40 with a main horizontal surface. Semiconductor die 40 extends to an outer edge 18. In the exemplary embodiment, outer edge 18 circumferentially surrounds die 40 which is, in the plane view, substantially shaped as a rectangle, for example square-shaped. Die 40 includes an active area 110 and a peripheral area 120. FIG. 1 corresponds to a view on the main horizontal surface or top surface of die 40. Typically, FIG. 1 also corresponds to a horizontal cross-section through a portion of die 40 next to the main horizontal surface. For sake of clarity, any substructures of active area 110 and metallizations arranged on active area 110 are not illustrated in FIG. 1. Active area 110 may include a plurality of cells, for example a plurality of MOSFET-cells, an IGBT-cells, and/or TEDFET-cells, i.e. cells of a Trench Extended Drain Field-Effect Transistor. However, active area 110 may also include only one bipolar transistor or one diode. Typically, active area 120 includes at least one rectifying junction, more typically a pn-junction 14a.

According to an embodiment, peripheral area 120 includes a dielectric structure 7 which surrounds active area 110 and extends from the main horizontal surface into semiconductor die 40. Dielectric structure 7 forms a semiconductor-insulator interface 19 with die 40 which is inclined against outer edge 18. Accordingly, an edge termination structure is formed in the peripheral area 120. Typically, an acute angle α ranging from about 1° to about 20° is formed between substantially straight portions of semiconductor-insulator interface 19 and substantially straight portions of outer edge 18. The acute angle α may also be larger than about 20°, for example about 25% or even larger. However, this will result in a dielectric structure 7 which requires a correspondingly larger area.

In the exemplary embodiment, the peripheral area 120 is arranged in an outer n-type semiconductor region 2 of semiconductor die 40 and the active area 110 includes a p-type semiconductor region 1 forming a pn-junction within the semiconductor die 40. A portion 14a of the pn-junction may extend to the main horizontal surface next to the peripheral area 120. Accordingly, the p-type semiconductor region 1, and thus the active area 110, is surrounded by the dielectric structure 7 but not insulated from the outer n-type semiconductor region 2.

When the semiconductor device 100 is in a blocking mode, i.e. when the pn-junction is reverse-biased, the electric field caused by the pn-junction is, at least in a horizontal direction, redistributed by the edge termination structure. More specifically, the dielectric material of dielectric structure 7, for example silicon oxide, silicon nitride, silicon oxynitride or a stack of these materials, tolerates a much higher electric field than the semiconductor material of die 40. Accordingly, dielectric structure 7 may carry a substantial portion, more typical a large portion, even more typical a major portion of the electric field during the blocking mode. On the other hand, the sources of an electric field are charges. Accordingly, the electric field during the blocking-mode is to be balanced by respective counter charges. According to an embodiment, this is achieved by charges of a space charge region in the semiconductor material and surface charges on or at the semiconductor-insulator 19. Accordingly, an edge termination that only requires a very small area of die 40 is provided. According to simulations, a rated blocking voltage of 600V is possible with such edge terminations having a horizontal extension of only about 15 μm or even less, compared to about 100 μm or more occupied by known edge terminations structures at the same blocking voltage.

Due to inclining dielectric structure 7 against the outer edge 18, there is, during blocking mode, always a component of the electric field that is parallel to the semiconductor-insulator 19. Accordingly, charge carriers that are generated thermally or by ionizing radiation during the blocking mode, are guided along the semiconductor-insulator to a junction and/or terminal where they are discharged and/or recombined. This is particularly important for holes ⊕ (p-charge carriers) which are in the exemplary embodiment illustrated in FIG. 1 guided to the pn-junction 14a during the blocking mode. Electrons are typically discharged to a metallization on the backside in contact with the outer n-type semiconductor region 2 and/or an optional adjoining n$^+$-type contact region 3. This avoids charge accumulation during the blocking mode and thus reduces switching losses. It goes without saying that the doping relations may also be reversed and that also electrons (n-charge carriers) can be guided by the dielectric structure 7.

Dielectric structure 7 is typically arranged in a vertical trench 27 extending from the main horizontal surface into semiconductor die 40. Vertical trench 27 may be completely filled with a dielectric material such as silicon oxide or only partly filled. Vertical trench 27 at least includes an insulated side wall 91 forming the semiconductor-insulator interface 19 with adjoin mesa regions 2. The insulated side wall 91 may, in the horizontal direction, extend to the active area 110 and the p-type semiconductor region 1, respectively.

In the exemplary embodiment, dielectric structure 7 is formed as a rectangular dielectric spiral 70. Typically, the rectangular dielectric spiral 70 winds at least two times, more typically, at least 5 times, even more typically at least ten times around the active area 110. Accordingly, several insulator-semiconductor interfaces 19 are arranged between the pn-junction and outer edge 18. This allows a reduction in the electric field during the blocking mode in the semiconductor regions between dielectric structure 7 and outer edge 18 to values that are much lower, typically at least one order of magnitude lower, more typically at least two order of magnitude lower than the electric field in the edge termination structure formed by the dielectric structure 7 and the surrounded semiconductor mesas. In other words, a major portion of the blocking voltage drops across the edge termination structure. Typically, the electric field strength during the blocking mode is very low, for example substantially zero, in the semiconductor regions 2 between dielectric structure 7 and outer edge 18. This may be achieved by choosing the doping concentration of the mesa regions arranged between the insulator-semiconductor interfaces 19 such that the integral doping concentration of the mesa regions along a line which is substantially perpendicular to the insulator-semiconductor interfaces 19 substantially matches the breakdown charge. Dimensioning the edge termination structure such that the electric field during the blocking mode is substantially zero results in a very robust semiconductor device 100 since its blocking capability is not or at most only slightly influenced by external contaminations and boundary conditions such as additional contact pads and conducting paths arranged on the main horizontal surface. Furthermore, the doping concentration of the semiconductor regions 2 which are arranged between dielectric structure 7 and outer edge 18 may be chosen higher since these semiconductor regions are typically at most exposed to low electric fields during the blocking mode.

Next to corner regions of the active area 110, the dielectric structure 7 surrounds the pn-junction and the active area 110, respectively, from two sides in plane view and a horizontal cross-section, respectively. In the exemplary embodiment, the dielectric structure 7 is substantially L-shaped in the corner regions. This means that the dielectric structure 7 includes two portions which are in plane view and in the horizontal cross-section, respectively, arranged at an angle of about 90°. The two portions may adjoin each other as illustrated in FIG. 1. In other embodiments, between the two portions an adjoining transition portion is arranged which is rounded and/or curved and/or chamfered. Accordingly, the transition portion provides a smoother transition between the two portions. Thus, the electric field may be better distributed during the blocking mode of the semiconductor device 100.

Typically, dielectric structure 7 includes silicon oxide, for example a thermal silicon oxide. During the formation of silicon oxide, positive charges may be trapped in the silicon oxide. These trapped charges may reduce the blocking capability of semiconductor device 100. According to an embodiment, at least major portions of the insulator-semiconductor interface 19 are arranged such that they extend substantially along a crystal plane <100>, <010>, <001> of semiconductor die 40. Typically, at least major portions of the insulator-semiconductor interface 19 are orientated along a plane forming, in a horizontal cross-section, with the crystal plane <100>, <010>, <001> an angle of less than about +/−15°, more typically of less than about +/−10°, and even more typically of less than about +/−5°. In doing so, entrapment of positive charges during the forming of the dielectric structure 7 may be avoided or at least significantly reduced. Accordingly, the blocking capability of semiconductor device 100 may be improved. In the exemplary embodiment, the main horizontal surface is parallel to the crystal plane <001> of silicon semiconductor die 40. In other embodiments, the main horizontal surface is parallel to crystal plane <010> or <100>. In these embodiments, at least major portions of the insulator-semiconductor interface 19 may be orientated substantially parallel to crystal plane <001>.

Alternatively and or in addition, dielectric structure 7 includes fixed negative charges to at least compensate positive fixed charges. For example, dielectric structure 7 may be formed as an aluminum-doped or cesium-doped silicon oxide. The total charge of dielectric structure 7 may be adjusted by the concentration of dopants and process conditions.

Typically, the rectangular dielectric spiral 70 includes a sequence of substantially block-shaped spiral segments such that a distance a between neighbouring parallel spiral segments is substantially constant. Accordingly, the electric field during the blocking mode may be better balanced between different mesas and spiral segments, respectively. Thus the blocking capability of semiconductor device 100 may be further improved.

Figure 2:
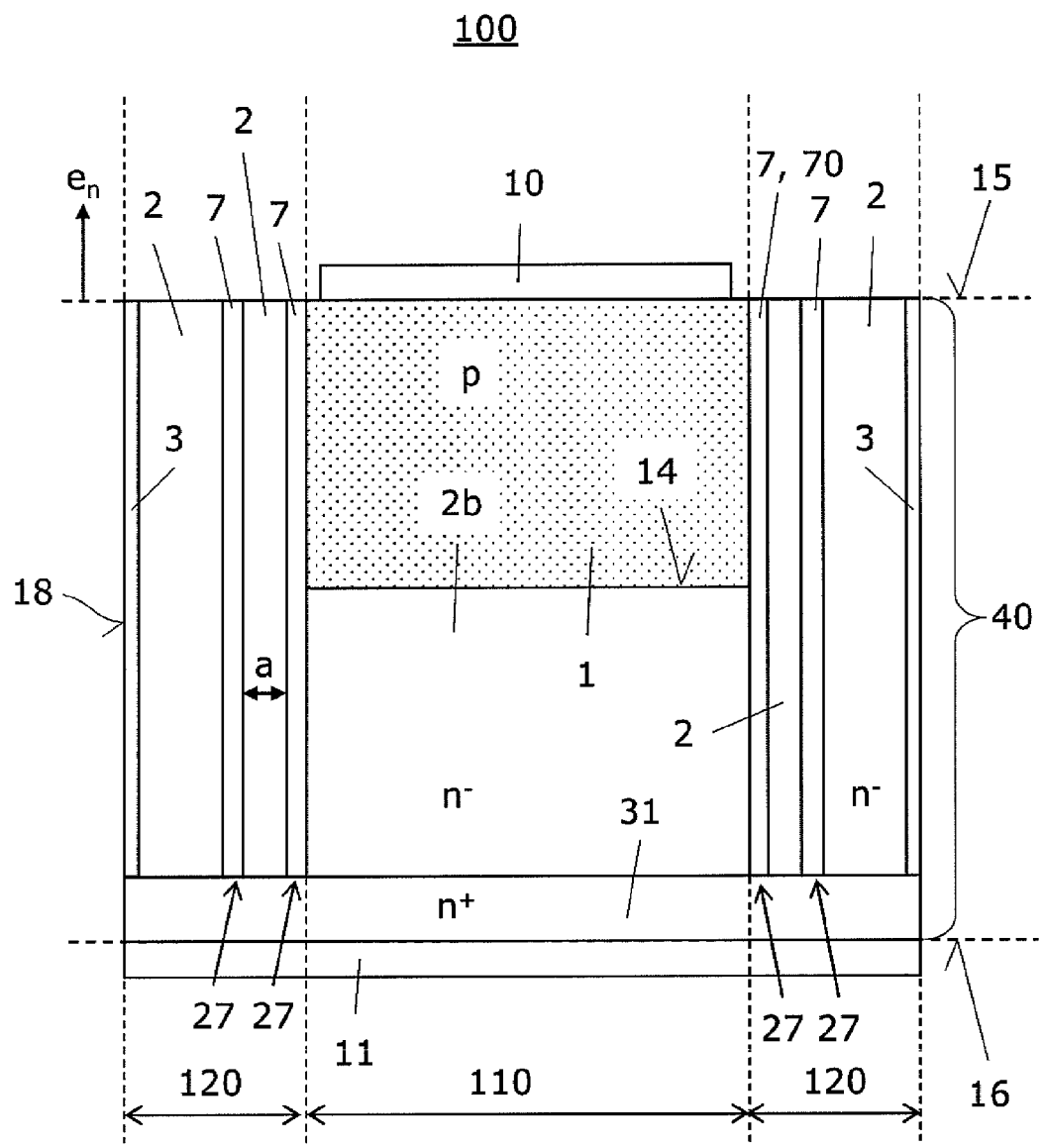
FIG. 2 schematically illustrates, in a vertical cross-section, a semiconductor device according to one or more embodiments.

FIG. 2 shows a typical vertical cross-section along line s of semiconductor device 100 illustrated in FIG. 1. In the exemplary embodiment, semiconductor device 100 may be operated as a diode. Accordingly, p-type semiconductor region 1 forms an anode region in contact with a first metallization 10 arranged on anode region 1 and forming an anode metallization. A substantially horizontally orientated pn-junction 14 is formed in the active area 110 between anode region 1 and a typically n⁻-type semiconductor region 2b which is in ohmic contact with a second metallization 11 forming a cathode metallization via a n⁺-type cathode contact region 31. Typically, semiconductor device 100 is a pin-diode (positive intrinsic negative diode). Whereas the anode metallization 10 is only formed in the active area 110, the cathode metallization 11 may cover a back surface 16 arranged opposite to the main horizontal surface 15 also in the peripheral area 110. Since the cathode contact region 31 extends in the horizontal direction into the peripheral area 120, the mesa regions 2 between the vertical trench portions 27 and the mesas 2, 3 between outer edge 18 and dielectric structure 7 are also in ohmic contact with the second metallization 11 to allow discharge of thermally generated electron and/or electrons generated by radiation during the blocking mode of semiconductor device 100.

According to an embodiment, dielectric structure 7 extends vertically below pn-junction 14, for example to cathode contact region 31 or even to the second metallization 11. Accordingly, the electric field during the blocking mode can safely be reduced in horizontal direction by the dielectric structure 7 and the adjoining mesa regions 2. Typically, a sequence of insulating regions 7 which are spaced apart by respective mesa regions 2 are, in vertical cross-sections, arranged in the peripheral area 120.

Typically, a horizontal extension of the illustrated portions of vertical trench 27 is, in the vertical cross-section, substantially constant. The horizontal extension of the portions of vertical trench 27 may, for example, range from about 100 nm to about 10 µm, more typically from about 500 nm to about 5 µm, and even more typically from about 0.8 µm to about 3 µm. In other embodiments, the horizontal extension of the vertical trench portions 27 may be smaller in a region distal to main horizontal surface 15 compared to a region next to main horizontal surface 15.

Figure 3:
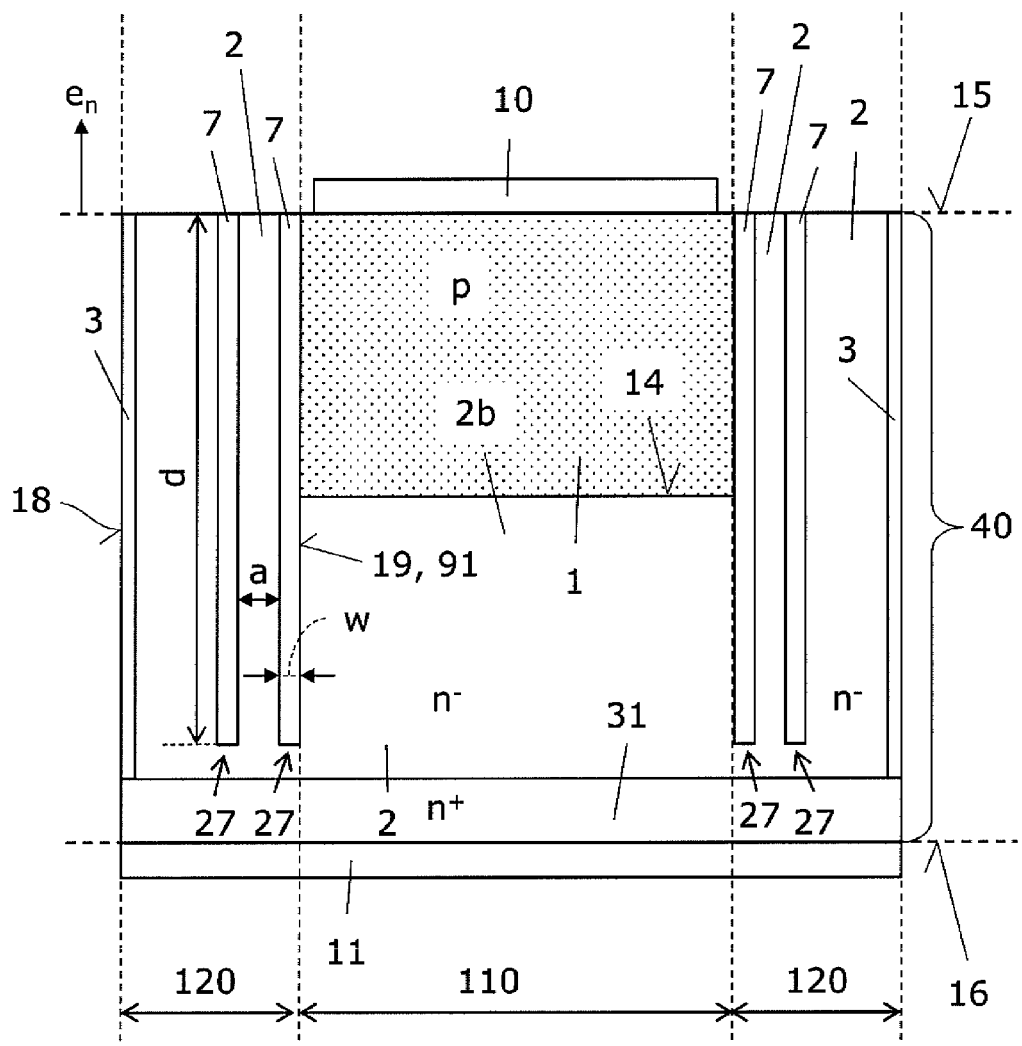
FIG. 3 schematically illustrates, in a vertical cross-section, a semiconductor device according to one or more embodiments.

Next, an embodiment is described with reference to FIG. 3. Semiconductor device 101 shown in FIG. 3 is very similar to the exemplary embodiment described above with regard to FIGS. 1 and 2. However, the dielectric structure 7 of semiconductor device 101 extends vertically not to the cathode contact region 31 but only down to a certain depth d which is, however, larger than a depth at which the electric field during the blocking mode is dropped to about a quarter of the breakdown field strength of the semiconductor material in case the semiconductor material in the mesas 2 is silicon and the dielectric structure 7 consists of $SiO_2$. For other materials a different value for the depth d may be required. This is for the following reasons.

Assuming horizontally equally spaced spiral segments of dielectric structure 7, as illustrated with respect to FIG. 1, and neglecting boundary effects, the total width and the blocking capability, respectively, of the resulting edge termination structure is mainly determined by the field strength in the dielectric material of the spiral segments of dielectric structure 7 and the ratio of the width w of the spiral segments and the width a of the mesa region in a direction which is normal to the insulator-semiconductor interface 19. For silicon as semiconductor material of the mesas 2 and silicon oxide as material of the dielectric structure 7, the field strength in the silicon oxide is, due to the difference in the permittivity, about three times as high as the field strength in the mesas 2. Accordingly, the voltage drop across the edge termination structure is, during the blocking mode assuming equal widths (w=a), about four times higher compared to the voltage drop in homogeneous silicon of the same size (w+a). In case w exceeds a, even a higher blocking voltage can be reached compared to a homogeneous semiconductor having the same size. Accordingly, the dielectric structure 7 typically extends at least to a depth at which the electric field strength in the dielectric structure 7 during the blocking mode is equal to or lower than $$E_{mesa} = \frac{\varepsilon_{ins}}{\varepsilon_{mesa}} \cdot E_{BR} \quad (1)$$

with $E_{mesa}$, $E_{BR}$ and $\varepsilon_{mesa}$ being the actual electric field strength, the critical electric field strength and dielectric constant of the semiconductor material respectively while $\varepsilon_{ins}$ being the dielectric constant of the dielectric structure 7. Using silicon and silicon dioxide as an example, the electric field strength in the dielectric structure 7 has to drop to about a quarter of the critical field strength or below. For non-punch through silicon semiconductor devices 101, for which the electric field in the blocking mode does not reach the back surface 16, the dielectric structure 7 and vertical trenches 27, respectively, extend to at least about three quarters of the vertical extension of die 40. Of course, using different semiconductor materials and/or dielectric materials, for example porous silicon oxide, and/or different width a, w of mesas 2 and spiral segments, respectively, will result in correspondingly different design rules. Generally, the blocking capability be of the edge termination structure as disclosed herein can be estimated as:

$$bc = \left( \frac{\varepsilon_{mesa}}{\varepsilon_{ins}} \cdot \frac{w}{a} + 1 \right) \cdot bc_{mesa}, \quad (2)$$

where $\varepsilon_{mesa}$, $\varepsilon_{ins}$, and $bc_{mesa}$ are the dielectric constant of the semiconductor material, the dielectric constant of the dielectric structure 7 and the blocking capability of a homogeneous region of the semiconductor material with equal total size (a+w), respectively. Accordingly, the width w of the segments of dielectric structure 7 is typically chosen larger than the width a of the mesas 2.

As can be inferred from equation (1), dielectric structure 7 and vertical trench 27, respectively, typically extend vertically at least to a depth d at which the electric field in the dielectric structure 7 during the blocking mode drops by a factor f $$f = \frac{\varepsilon_{ins}}{\varepsilon_{mesa}} \quad (3)$$

given by the ratio between the dielectric constant $\varepsilon_{ins}$ of the insulating regions formed in the vertical trench 27 and the dielectric constant $\varepsilon_{mesa}$ of the mesas.

Furthermore, using comparatively thin mesa regions (a<w) reduces the voltage drop in the mesa regions 2 during the blocking mode. Accordingly, generated charge carriers will gain less energy when accelerated during the blocking mode. This reduces the risk of forming hot charge carriers, avalanche multiplication, and entrapment of charge carriers in dielectric structure 7. Thus, the electric field strength in the mesas may significantly be increased above the bulk breakdown field strength for this semiconductor material without risking avalanche multiplication and/or breakdown. Thus, the blocking capability may further be increased and/or the total width of the edge termination structure reduced. After reaching the insulator-semiconductor interface 19, the charge carriers are guided along the insulator-semiconductor interface 19 and finally drained off to a contact, for example a metallization, or recombined at a pn-junction.

Even further, positive surface charges at the insulator-semiconductor interface 19 between n-type mesa regions and the segments of dielectric structure 7 typically contribute to the blocking capability, in particular if many insulator-semiconductor interfaces 19 are formed between active area 110 and outer edge 18. In doing so, an optional lateral field-stop region may be omitted.

Figure 4:
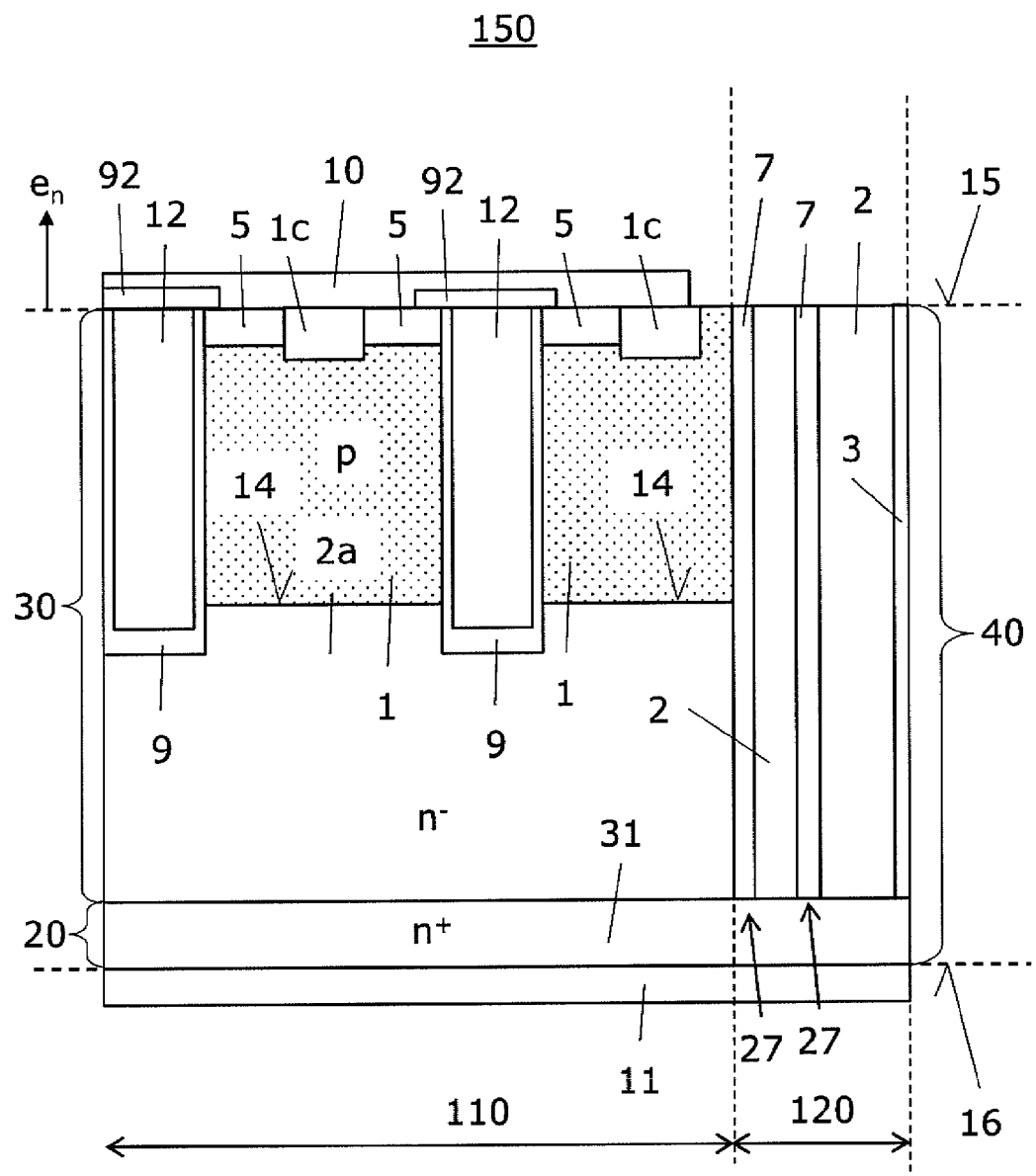
FIG. 4 schematically illustrates, in a vertical cross-section, a semiconductor device according to one or more embodiments.

FIG. 4 schematically illustrates, in a vertical cross-section, a semiconductor device 150. Semiconductor device 150 shown in FIG. 4 is similar to the exemplary embodiment described above with regard to FIGS. 1 and 2. However, semiconductor device 150 may be operated as a MOSFET. For sake of clarity, only a most right portion of die 40 is illustrated.

In the exemplary embodiment, semiconductor device 150 includes in the active area 110 insulated gate electrodes 12 which extend from main horizontal surface 15 through the p-type semiconductor region 1 forming a body region partially into an n⁻-type drift region 2a. Accordingly, semiconductor device 150 includes a vertical trench transistor structure. However, this is only one embodiment. In another embodiment, planar gate electrodes 12 are arranged in or on top of main horizontal surface 15. Gate electrodes 12 are insulated from the semiconductor regions 1, 2a and the first metallization 10 forming a source metallization by a gate dielectric region 9 and a dielectric plug 92, respectively. Gate electrodes 12 may be connected to another part of metallization on main horizontal surface 15 which is not shown here. N⁺-type source regions 5 and p⁺-type body contact regions 1c are embedded in body region 1 and in ohmic contact with the source metallization 10. By appropriately biasing gate electrodes 12 against body regions 1a channel region can be formed along the gate dielectric regions 9 in body region 1. Thus, a current flow between source metallization 10 and a second metallization 12 forming a drain metallization through the channel region, the drift region 2a and a drain contact region 31 can be switched and/or controlled. Semiconductor device 150 is typically a power semiconductor device having a plurality of MOSFET-cells. The peripheral area 120 includes as part of a vertical edge termination structure a dielectric structure 7 as explained above with reference to FIGS. 1 to 3.

Typically, die 40 includes a highly doped substrate 20 and an epitaxial layer 30. Substrate 20 includes one or more back-side contact regions. In the exemplary embodiment, substrate 20 includes one n⁺-type contact region 31. The vertical extension of substrate 20 and the back-side contact region 31, respectively, does not contribute to the blocking capability of the semiconductor device. The blocking capability is determined by the doping concentrations and the vertical extensions of the semiconductor regions 1, 2a forming pn-junction 14. The total thickness of these semiconductor regions is in the following also referred to as active device thickness. In the exemplary embodiment, the active device thickness of semiconductor device 150 substantially matches the vertical extension of epitaxial layer 30. For silicon, as a rule of thumb, the active device thickness in μm is about the required blocking voltage in Volts divided by 10. For example, the active device thickness is about 50 μm to about 60 μm for a 600 V silicon semiconductor device and about 25 μm to about 30 μm for a 300 V silicon semiconductor device. These estimates for the active device thickness typically also apply to the other semiconductor devices described herein. For reason of mechanical stability of die 40, the vertical thickness of the layer with the back-side contact regions, i.e. the vertical thickness of substrate 20 in the exemplary embodiment illustrated in FIG. 4, is typically larger than the active device thickness.

Figure 5:
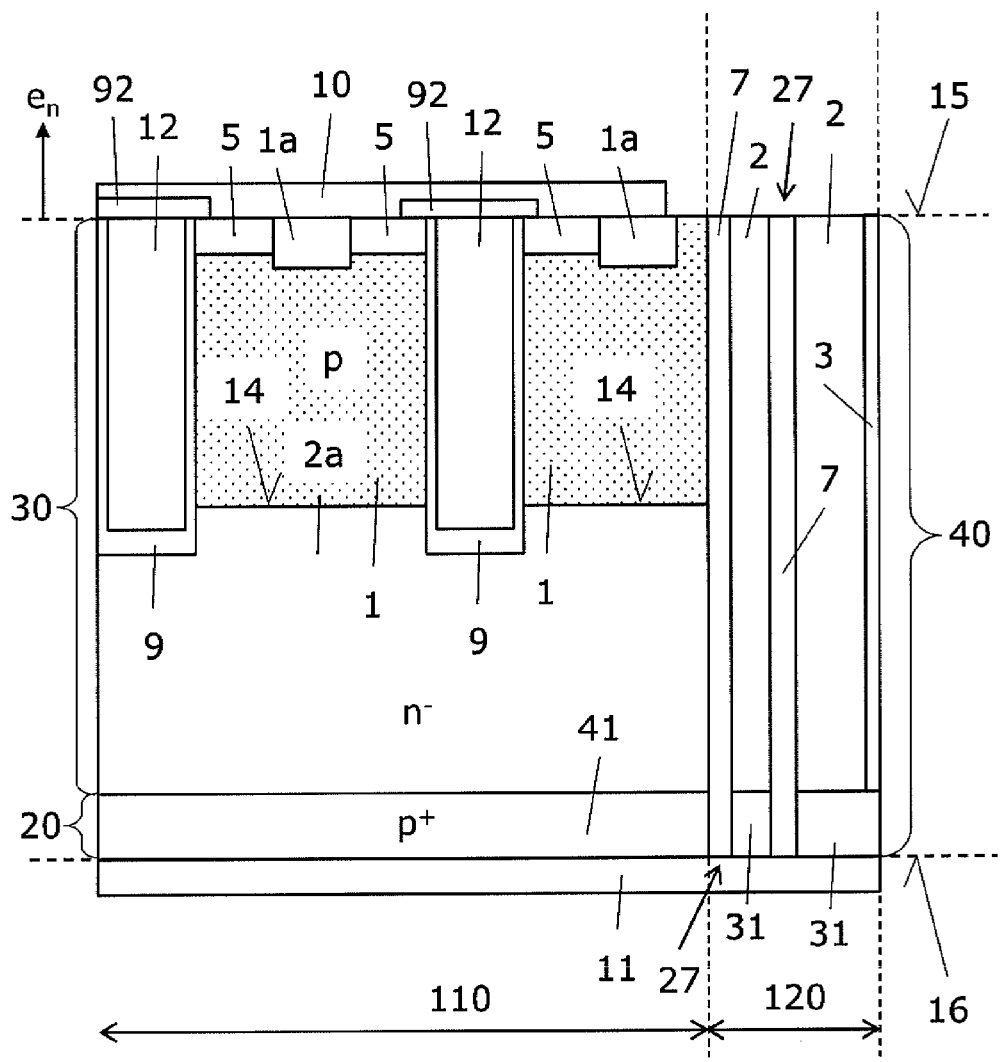
FIG. 5 schematically illustrates, in a vertical cross-section, a semiconductor device according to one or more embodiments.

FIG. 5 schematically illustrates, in a vertical cross-section, a semiconductor device 170. Semiconductor device 170 shown in FIG. 5 is similar to the exemplary embodiment described above with regard to FIG. 4. However, semiconductor device 170 may be operated as an IGBT. For this purpose, n⁺-type contact region 31 is exchanged in the active area by a p⁺-type collector region 41 in ohmic contact with the second metallization 12 forming a collector metallization. In the exemplary embodiment, collector region 41 is insulated from n⁺-type contact region 31 in the peripheral area 120 by dielectric structure 7 which extends to the collector metallization 11 and back surface 16, respectively. The peripheral area 120 includes as part of a vertical edge termination structure a dielectric structure 7 as explained above with reference to FIGS. 1 to 3.

Figure 6:
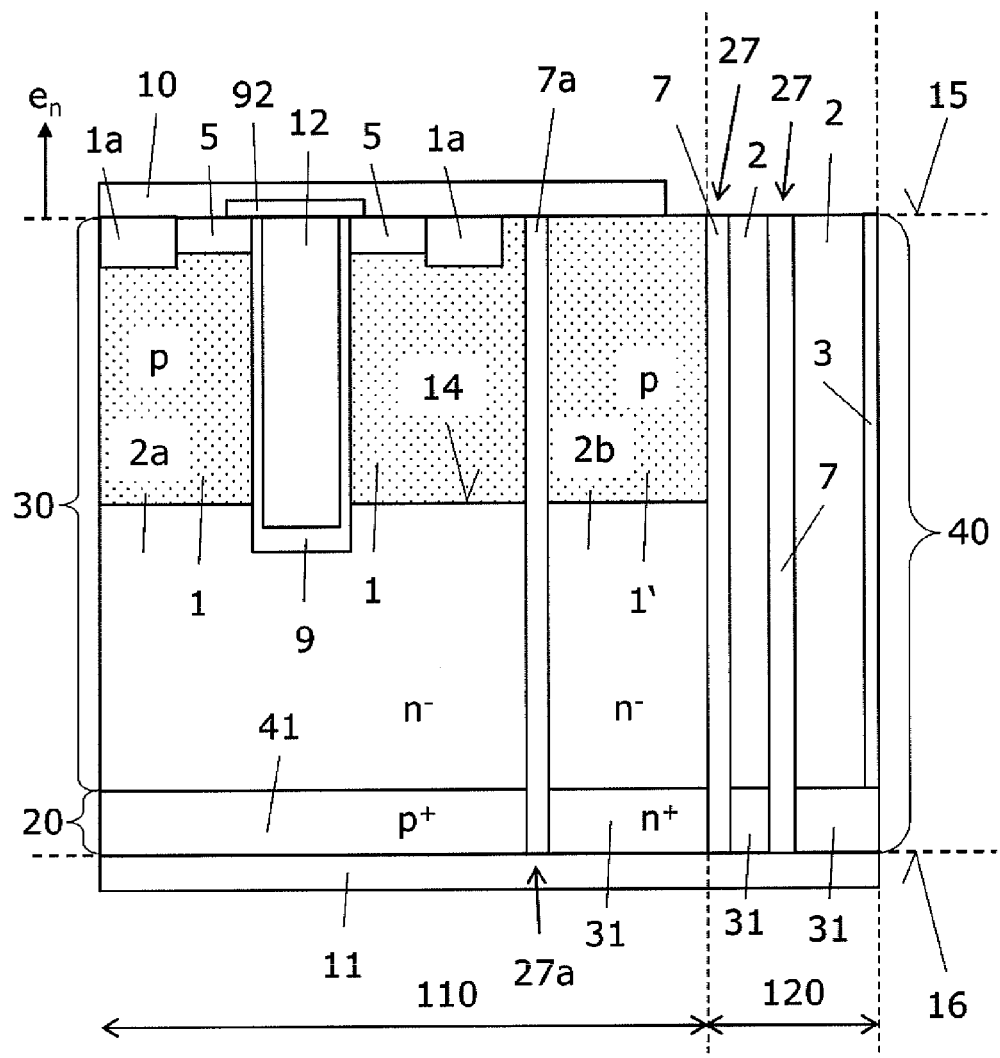
FIG. 6 schematically illustrates, in a vertical cross-section, a semiconductor device according to one or more embodiments.

FIG. 6 schematically illustrates, in a vertical cross-section, a semiconductor device 175. Semiconductor device 175 shown in FIG. 6 is similar to the exemplary embodiment described above with regard to FIG. 5 and may also be operated as an IGBT. However, semiconductor device 170 further includes in the active area 110 an integrated free-wheeling diode which is separated from the IGBT-cell by an additional deep vertical trench 27a filled with a dielectric layer 7a which both extend from main horizontal surface 15 to back surface 16. Body region 1 of the IGBT-structure and anode region 1' of the diode-structure may be formed from a common p-type semiconductor region but may also have different doping concentrations and/or vertical extensions. In the exemplary embodiment, dielectric layer 7a is used to separate an IGBT-structure from a diode structure. It goes without saying that a plurality of dielectric layers 7a may be used in active area 110 to separate and/or insulate different semiconductor structures, for example adjacent cells, from each other. Dielectric structure 7 and dielectric layer 7a may be formed in common processes.

Figure 7:
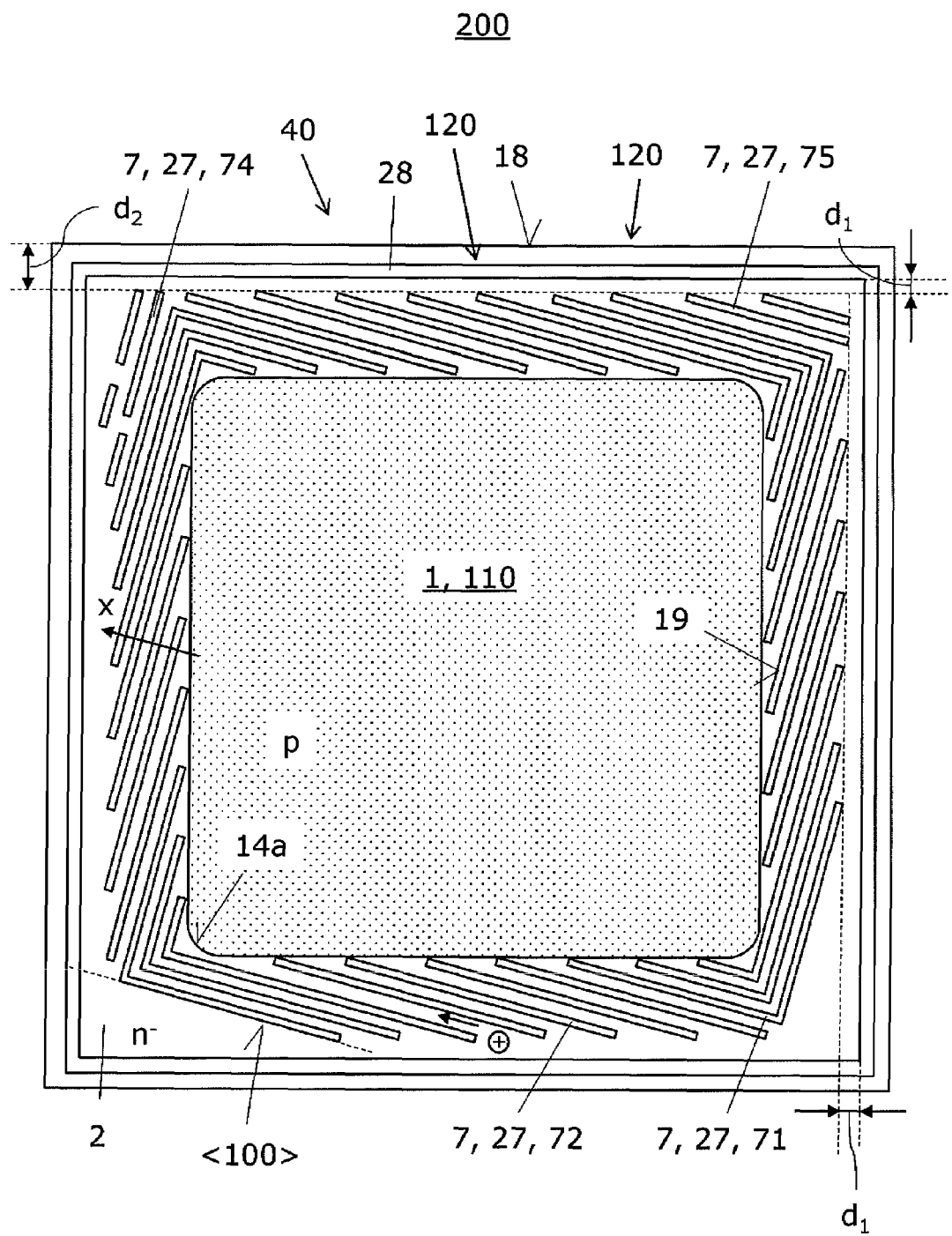
FIG. 7 schematically illustrates, in a plane view, a semiconductor device according to one or more embodiments.

FIG. 7 schematically illustrates, in a plane view, a semiconductor device 200. According to one or more embodiments. Semiconductor device 200 shown in FIG. 7 is similar to the exemplary embodiments described above with regard to FIGS. 1 to 6. However, dielectric structure 7 of semiconductor device 200 includes a plurality of dielectric regions 71, 72, 74, 75 arranged in separated vertical trenches 27 instead of one open circumferential dielectric structure formed in plane view as a spiral.

In the exemplary embodiment, the plurality of vertical trenches 27 is arranged around the active area 110. Typically, each vertical trench 27 is inclined against outer edge 18. Accordingly, charges, in particular holes ⊕, that are generated thermally or by ionizing radiation during the blocking mode of semiconductor device 200 are guided along the dielectric regions 71, 72, 74, 75 and are hence not accumulated. Accordingly, switching losses may be reduced.

Typically, vertical trenches 27 are, in plane view and in a horizontal cross-section, at least in sections or portions substantially formed as elongated rectangles. An acute angle is formed between outer edge 18 and vertical trenches 27 and/or their sections and/or the elongation direction of vertical trenches 27 and/or their sections, respectively. The acute angle typically ranges between about 1° and about 20°, more typically between 1° and 15°, and even more typically between 1° and 10°.

In the corner regions of active area 110, the vertical trenches 27 and dielectric regions 71, respectively, are, in the horizontal cross-section and in the plane view, respectively, substantially L-shaped, i.e. they include two portions which are, in the horizontal cross-section and in the plane view, respectively, arranged at an angle of about 90°. Accordingly, the vertical trenches 27 and dielectric regions 71, respectively, of the corner regions surround active area 110 from two sides. In the exemplary embodiment, each of the four corner regions is surrounded by three neighboring L-shaped vertical trenches 27 and dielectric regions 71, respectively. Closer to the corner regions of die 40, further substantially bar-shaped dielectric regions 74, 75, i.e. dielectric regions 74, 75 that are substantially shaped as elongated rectangles in plane view, may be arranged. Dielectric regions 74, 75 are substantially parallel to one of the two portions of the L-shaped dielectric regions 71. For sake of clarity, only two different exemplary designs of additional bar-shaped dielectric regions 74, 75 are illustrated in FIG. 7 for the upper corner regions. It goes without saying that each of the four corner regions may include additional bar-shaped dielectric regions 74, 75 according to one of the two exemplary designs. Between the corner regions, a plurality of substantially bar-shaped dielectric regions 72 is arranged. The substantially bar-shaped dielectric regions 72 are parallel to one of the two portions of the L-shaped dielectric regions 71 in the corner region. Dielectric structure 7 formed by the substantially bar-shaped regions 71, 74, 74 and the L-shaped dielectric regions 71 is, similar as explained above with respect to FIG. 1, typically also inclined against outer edge 18. Furthermore, the insulator-semiconductor interface 19 formed between mesa regions 2 of die 40 and dielectric structure 7 are typically also arranged substantially parallel to crystal planes <100>, <010> of die 40 to reduce incorporation of negative charges during forming dielectric structure 7.

Arranging the plurality of dielectric regions 71, 72, 74, 75 in separated vertical trenches 27 around active area 110 instead of one circumferential dielectric structure results in an edge termination structure which may require even less area than the edge termination explained above with reference to FIG. 1. Vertical cross-section through semiconductor device 200 may be similar as explained above with reference to FIGS. 2 to 6. Accordingly, active area 110 of semiconductor device 200 may, for example, include a diode, an IGBT and/or a MOSFET.

According to an embodiment, the edge termination structure of semiconductor device 200 further includes a closed vertical trench 28 surrounding the active area 110 and the vertical trenches 27. In the exemplary embodiment, closed vertical trench 28 is not inclined against outer edge 18. Closed vertical trench 28 may include a circumferential field plate, a circumferential poly-Silicon-filling, and a circumferential channel stop region. Due to the low electric field values in the mesa region 2 outside dielectric structure 7 during the blocking mode of semiconductor device 200, doping concentration of a semiconductor material filling closed vertical trench 28 and fixed charges in or at a dielectric material filling closed vertical trench 28 are uncritical.

Typically, vertical trenches 27 are substantially spaced apart from the closed vertical trench 28 and/or outer edge 18 by the same respective horizontal distance $d_1$, $d_2$, as illustrated in FIG. 7. In other embodiments, vertical trenches 27 and dielectric regions 71, 72, 74, 75 extend to closed vertical trench 28.

In addition, dielectric structure 7 may be spaced apart from a pn-junction 14a. Alternatively, dielectric regions 71 and/or dielectric regions 72 may, in horizontal direction, extend across pn-junction 14a. In addition, pn-junction 14a may have different radius at the corners and/or may have different distance to inner end of dielectric structures 7 at the corner and the straight parts of the termination structure.

Typically, at least four, more typically at least 10, even more typically at least 20 insulator-semiconductor interface 19 are crossed by each path x in a horizontal cross-section. Accordingly, even high electric fields can be absorbed by the edge termination structure. This is further explained in the following.

Figure 8:
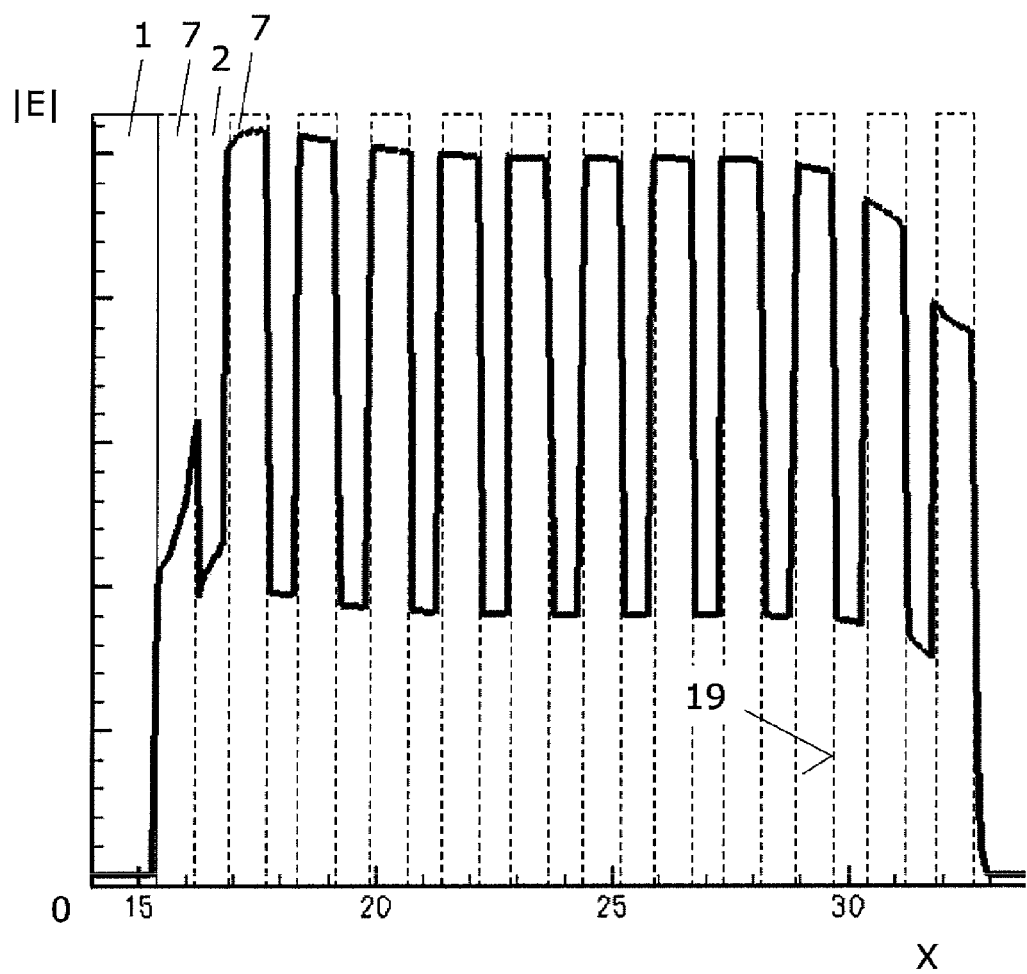
FIG. 8 schematically illustrates an electric field distribution in a semiconductor device according to an embodiment.
Figure 9:
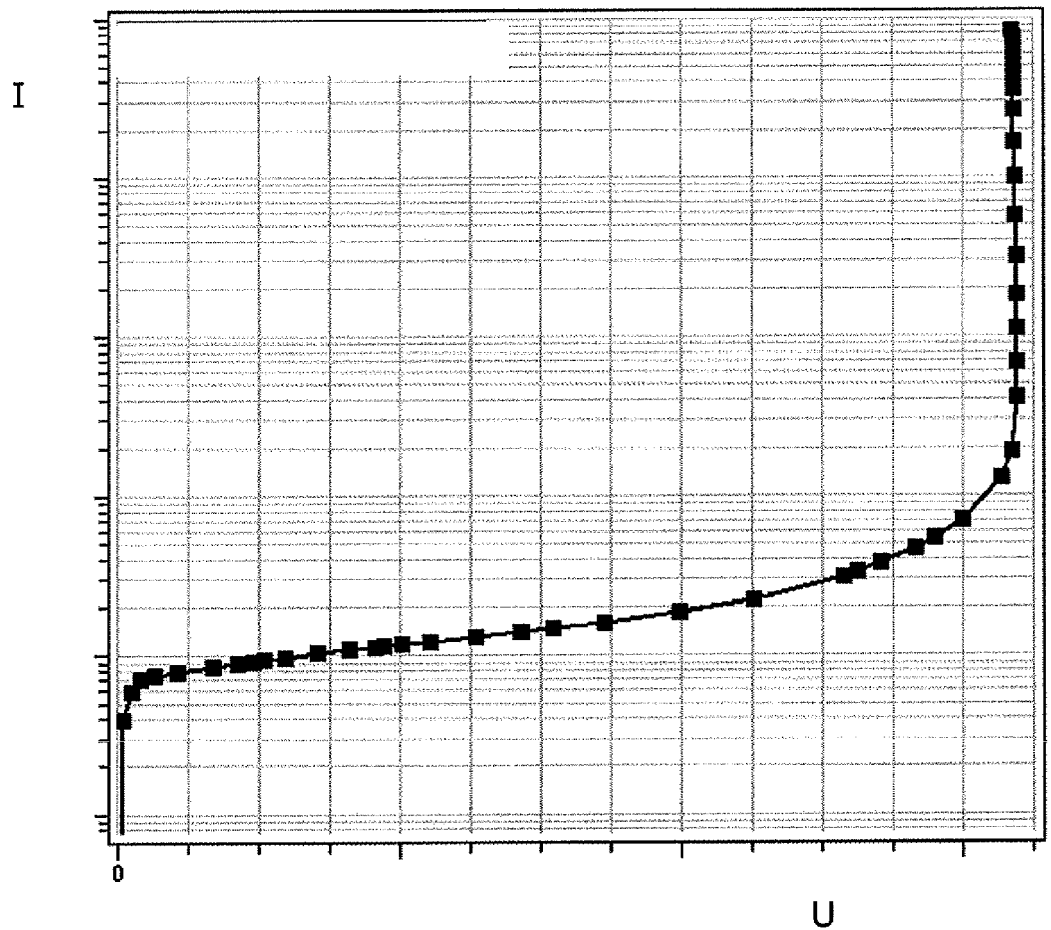
FIG. 9 schematically illustrates current-voltage characteristics in blocking mode in a semiconductor device according to an embodiment.

FIG. 8 schematically illustrates an electric field distribution across an edge termination structure during the blocking mode of a vertical silicon diode. A two dimensional device simulation was performed for an edge termination structure which is similar to the edge termination structures as explained above with reference to FIGS. 1 and 7. However, the dielectric structure 7 used for simulation has, in a vertical cross-section through the device, twelve portions made of silicon oxide. The simulation may, therefore, correspond to a vertical section along path x as shown in FIG. 1 when the dielectric spiral in FIG. 1 is replaced by a dielectric spiral which winds twelve times around the active area. The simulation may also correspond to a vertical section along path x similar as shown in FIG. 7 but with more vertical trenches. Electric field is shown as function of distance from p-type semiconductor region 1 at the main horizontal surface. As can be seen, electric field strength is, except for the outermost portions, about 2.5 times higher in the dielectric structure 7 compared to the electric field in the mesa regions 2. Accordingly, a major portion of the voltage drops across the dielectric structure 7. FIG. 9 schematically shows the corresponding current-voltage characteristics of the semiconductor device. A closer look reveals that a breakdown voltage of more than 600V can be achieved with this edge termination structure at a horizontal extension of only about 20 μm. Higher blocking capabilities may be achieved with more insulator-semiconductor interfaces 19 and/or wider parts of dielectric structures 7.

Figure 10:
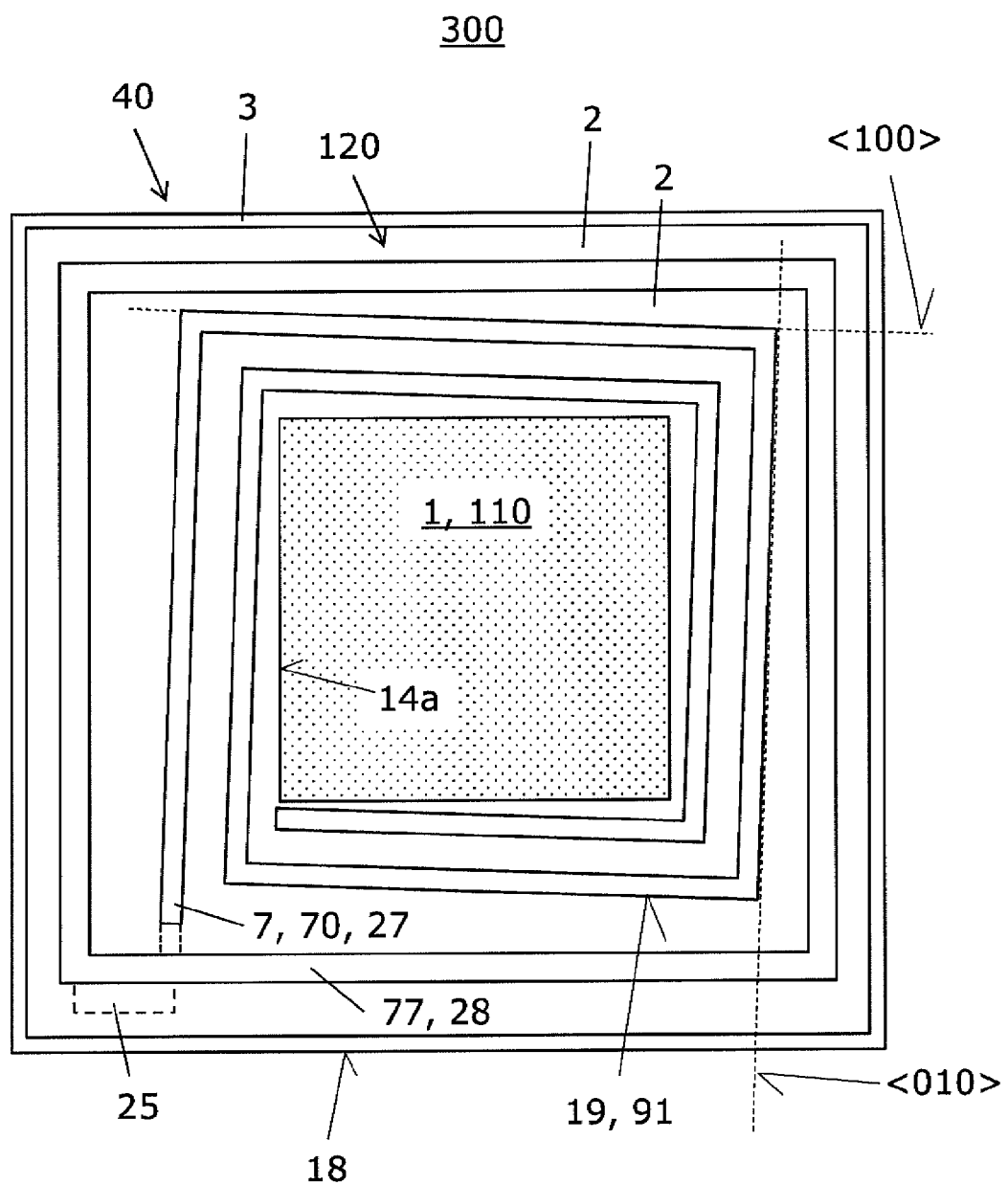
FIG. 10 schematically illustrates, in a plane view, a semiconductor device according to one or more embodiments.

FIG. 10 schematically illustrates, in a plane view, a semiconductor device 300. Semiconductor device 300 shown in FIG. 10 is similar to the exemplary embodiments described above with regard to FIG. 1. However, the rectangular dielectric spiral 70 of semiconductor device 300 is spaced apart from the active area 110. Furthermore, an optional closed circumferential trench 28 is arranged around the rectangular dielectric spiral 70 in the peripheral area 120. Circumferential trench 28 may, for example, be filled with a dielectric ring 77 forming a field-stop region. In this embodiment, the outermost spiral segment of dielectric spiral 70 may extend to the dielectric ring 77. To improve draining of holes during the blocking mode of semiconductor device 300, a butting contact 25, i.e. a short-circuited $n^+$-$p^+$-contact, may be formed next to the dielectric ring 77, for example close to the back surface of semiconductor device 300.

In other embodiments, the circumferential field-stop region is formed by an $n^+$-type ring-shaped structure 3 extending into die 40. $N^+$-type ring-shaped structure 3 may be formed by epitaxy, implantation, for example with protons, or diffusion, for example diffusion of phosphorous or selenium.

Figure 11:
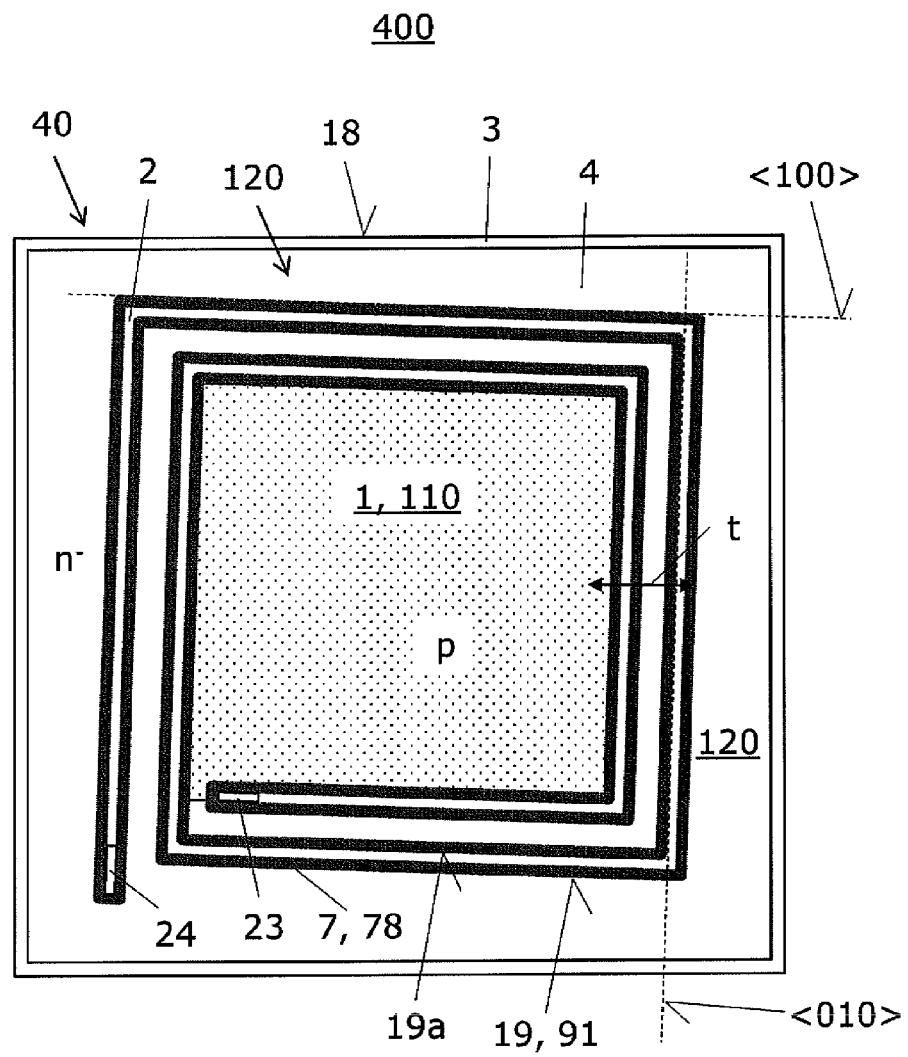
FIG. 11 schematically illustrates, in a plane view, a semiconductor device according to one or more embodiments.

FIG. 11 schematically illustrates, in a plane view, a semiconductor device 400. Semiconductor device 400 shown in FIG. 11 is similar to the exemplary embodiments described above with regard to FIG. 1. However, dielectric structure 7 of semiconductor device 400 is, in the plane view and a horizontal cross-section, respectively, formed as a hollow spiral 78. The closed sidewall 91 of vertical trench 27 of semiconductor device 400 is insulated and forms a closed insulator-semiconductor interface 19 with an n-type semiconductor region 4 forming a semiconductor mesa 4. Typically, the remaining inner portion of vertical trench 27 is also filled with an n-type semiconductor region 2 forming a semiconductor mesa 2. Semiconductor mesa 2 forms an additional closed insulator-semiconductor interface 19a with the dielectric structure 7. To improve discharge of holes and electrons generated during the blocking mode of semiconductor device 400, a highly doped p-type contact region 23 for holes and/or a highly doped n-type contact region 24 for electrons may be provided at the innermost spiral segment and the outermost spiral segment, respectively, of hollow spiral 78. Typically, contact region 23 is in ohmic contact with a first metallization (not shown in FIG. 11) arranged on the main horizontal surface of die 40. Likewise, contact region 24 is typically in ohmic contact with a second metallization (not shown in FIG. 11) arranged opposite to the first metallization.

In some embodiments, the dielectric regions 71, 72, 74, 75 arranged in separated vertical trenches 27 explained above with regard to FIG. 7 may also be replaced by respective hollow dielectric structures which are formed by dielectric layers arranged on the sidewalls of the vertical trenches 27 and filled in the remaining central portion with a semiconductor material.

Figure 12:
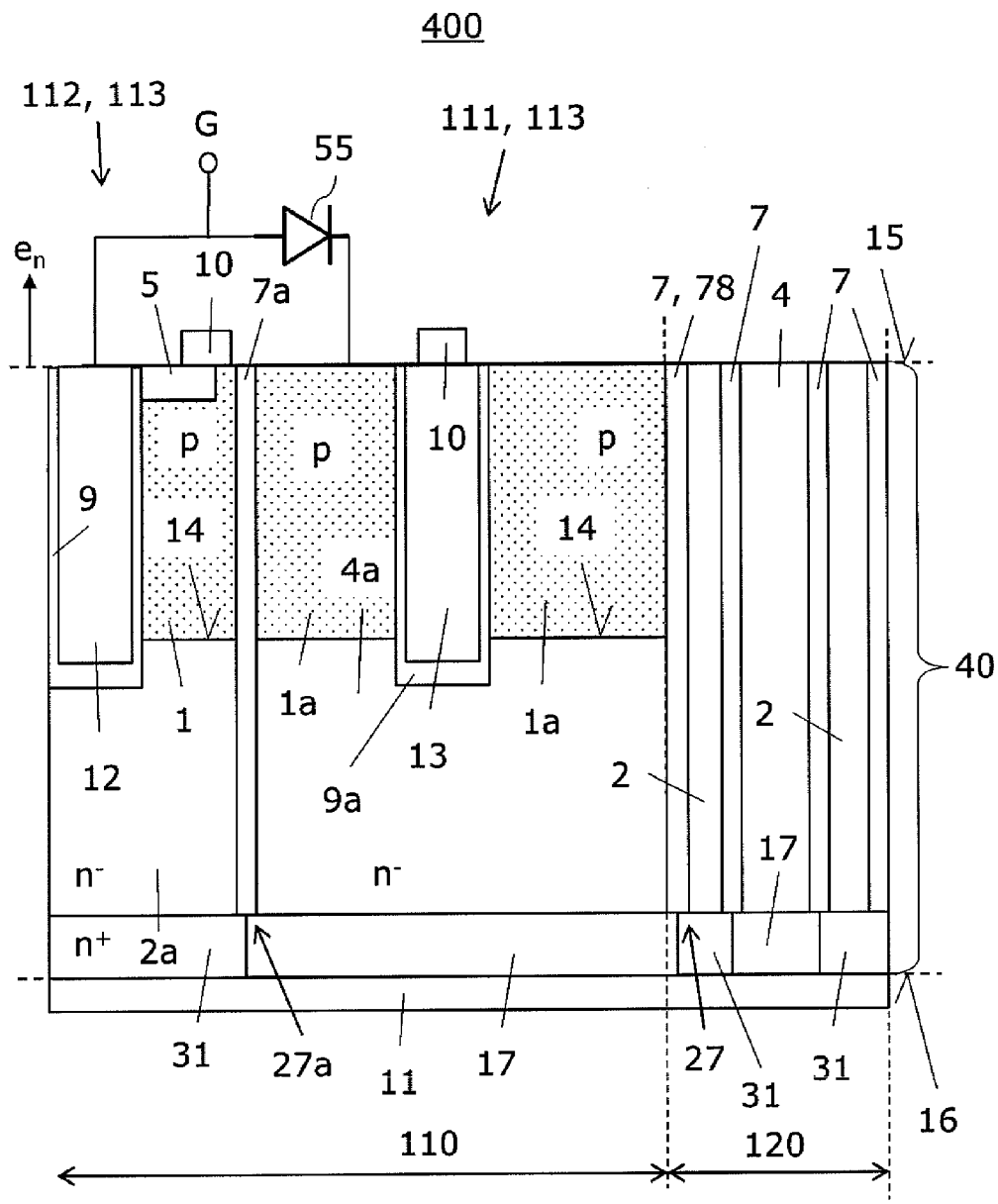
FIG. 12 schematically illustrates, in a vertical cross-section, a semiconductor device according to one or more embodiments.

FIG. 12 shows a typical vertical section along line t of semiconductor device 400 illustrated in FIG. 11. For sake of clarity only a most right portion of the active area 110 is illustrated in FIG. 12. In the exemplary embodiment, semiconductor device 400 may be operated as a TEDFET. Accordingly, active area 110 includes a vertical MOSFET-structure 112, which is similar to the MOSFET-structure explained above with regard to FIG. 4. For sake of clarity only a most right portion of the vertical MOSFET-structure 112 is illustrated in FIG. 12. A gate electrode 12 which is insulated from adjacent semiconductor regions by gate dielectric region 9 extends from main horizontal surface 15 through the p-type body region 1 and partially into an $n^-$-type drift region 2a. $N^+$-type source regions 5 and $p^+$-type body contact regions (not shown in FIG. 12) are embedded in body region 1 and in ohmic contact with the source metallization 10. The drift region 2a is in ohmic contact with the drain metallization 11 via drain contact region 31. In addition, a drift channel control structure 111 is arranged next to MOSFET-structure 112. A drift control region 4a, which may also be of $n^-$-type, is arranged adjacent to drift region 2a. Drift control region 4a is dielectrically insulated from drift region 2a. A dielectric layer 7a is arranged between drift region 2a and drift control region 4a and extends very deeply into semiconductor die 40. In the exemplary embodiment, dielectric layer 7a extends to a bottom dielectric layer 17. Accordingly, drift control region 4a is also insulated from drain metallization 11. The function of the drift control region 4a is to control a conducting channel in the drift region 2a along dielectric layer 7a if the MOSFET-structure is in its on-state. Drift control region 4a therefore serves to reduce the on-resistance of the overall transistor component.

Unlike in usual MOSFETs, drift region 2a of semiconductor device 400 may, disregarding of the type of the MOS transistor structure, be n-doped or p-doped. If, for example, in an n-type MOSFET-structure 112 drift region 2a is n-doped, then an accumulation channel is formed along dielectric layer 7a and controlled by drift control region 4a. In this embodiment, dielectric layer 7a is also referred to as accumulation layer. If in an n-type MOSFET-structure 112 drift region 2a is p-doped, then an inversion channel forms along dielectric layer 7a in drift region 2a, if the component is in its on-state. Like a usual MOSFET this component is in its on-state if a voltage is applied between source and drain regions 5, 31 or source and drain metallizations 10, 11, respectively, and if a suitable electrical potential is applied to gate electrode 12 that effects a conducting channel in body region 1 between source region 5 and drift region 2a. In an n-type MOSFET-structure 112 the voltage to be applied between drain region 31 and source region 5 in order to put the component in its on-state is a positive voltage, and the gate potential is a positive potential as compared to source potential.

If the semiconductor device 400 is in its on-state charge carriers are required in the drift control region 4a to form the accumulation or inversion channel along dielectric layer 7a in the drift region 2a. In a semiconductor device 400 having an n-type MOSFET structure 112, holes are required in the drift control region 4a for forming this conducting channel. These charge carriers in the drift control region 4a are only required, if the component is in its on-state. If the component is in its blocking state, these charge carriers are removed from drift control region 4a and—equivalently to drift region 2a—a space charge zone or depletion zone forms in drift control region 4a. In this connection it should be mentioned that drift control region 4a may be of the same conduction type as drift region 2a or may be of a complementary conduction type.

The charge carriers that are moved from drift control zone 4a, if the component is in its blocking mode, are stored in an integrated capacitor structure until the component is switched on for the next time. This integrated capacitor structure is formed in a connection region 1a that adjoins drift control region 4a and that is p-doped for an n-type component. Further, the integrated capacitor structure can partly extend into drift control region 4a. Connection region 1a and drift control region 4a act as the carrier layer for an insulated electrode 13 of the integrated capacitor structure. Electrode 13 is insulated by a dielectric layer 9a and in the following also referred to as insulated capacitor electrode. For providing charge carriers to the drift control zone 4a, if the component is switched on for the first time, i.e., if the integrated capacitor structure has not been charged, yet, drift control region 4a may be coupled to a gate terminal and gate metallization G, respectively, via connection region 1a. In this case, charge carriers are provided from a gate driver circuit that, in operation of semiconductor device 400, is coupled to the gate terminal G. A diode 55 that is coupled between gate terminal G and the connection region 1a serves to prevent discharging the drift control region 4a in the direction of the gate terminal G. Of course drift control zone 4a can also be charged by other means, e.g. by contacting to an external voltage source.

According to an embodiment, dielectric layer 7a arranged in vertical trench 27a and dielectric structure 7 arranged in vertical trench 27 extend to bottom dielectric layer 17. Accordingly, discharging drift control region 4a to adjacent semiconductor regions 2, 2a is prevented. Further more, dielectric structure 7 formed in the exemplary embodiment as a hollow spiral 78 provides together with the mesa regions 2 and 4 an edge termination structure with only low chip area. Even further, dielectric layer 7a and dielectric structure 7 may at least partly be formed in common processes. This will be explained below with regard to FIGS. 22 to 30.

Figure 13:
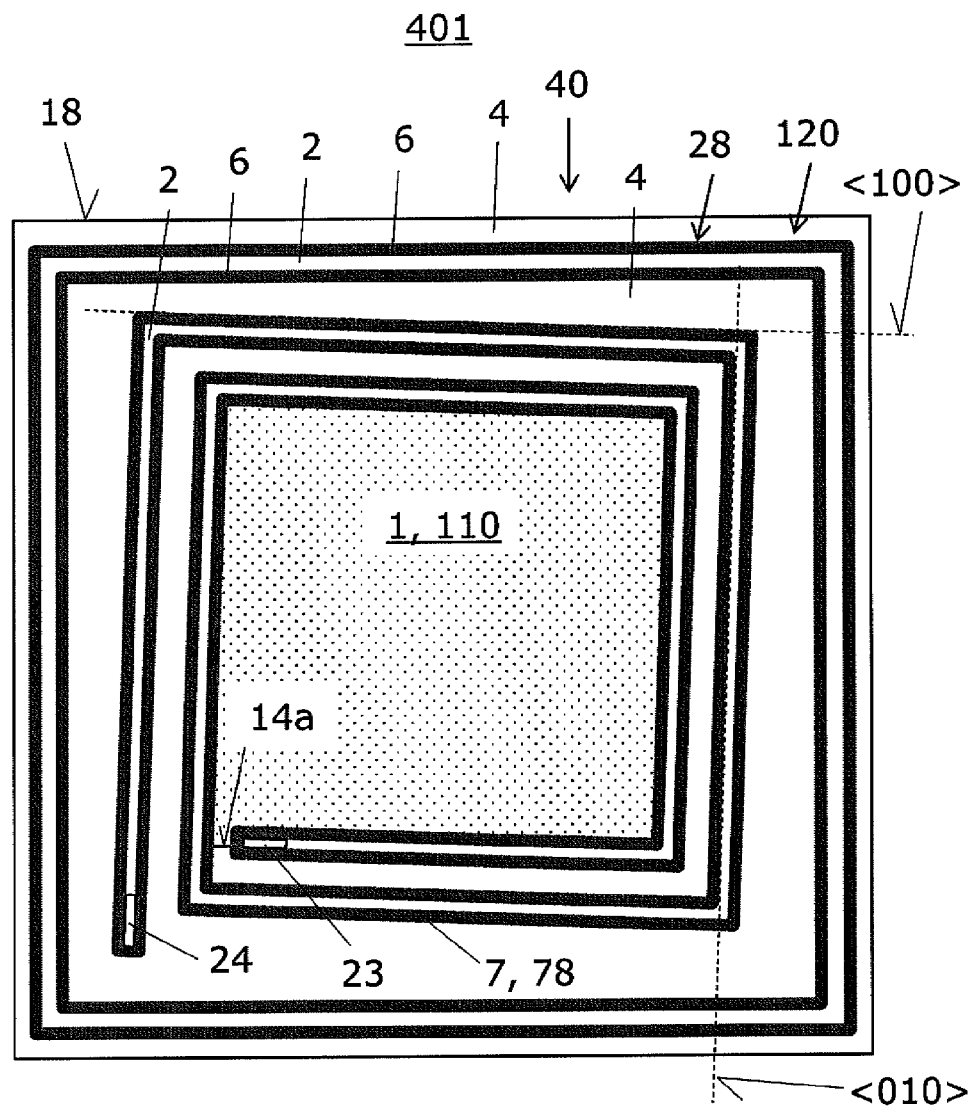
FIG. 13 schematically illustrates, in a plane view, a semiconductor device according to one or more embodiments.

Next, an embodiment is described with reference to FIG. 13. Semiconductor device 401 shown in FIG. 13 is very similar to the exemplary embodiment described above with regard to FIGS. 11 and 12 and may also be operated as a TEDFET. However, an additional closed circumferential trench 28 is arranged around rectangular hollow dielectric spiral 78 in the peripheral area 120 of semiconductor device 401.

In the exemplary embodiment, the sidewalls of closed circumferential trench 28 are insulated by two circumferential dielectric layers 76 that extend in the vertical direction typically also to the bottom dielectric layer. Between the two circumferential dielectric layers 76 a mesa region 2 is arranged. Circumferential trench 28 may, however, also be completely filled with a dielectric ring forming a field-stop region as explained above with regard to FIG. 10.

Figure 14:
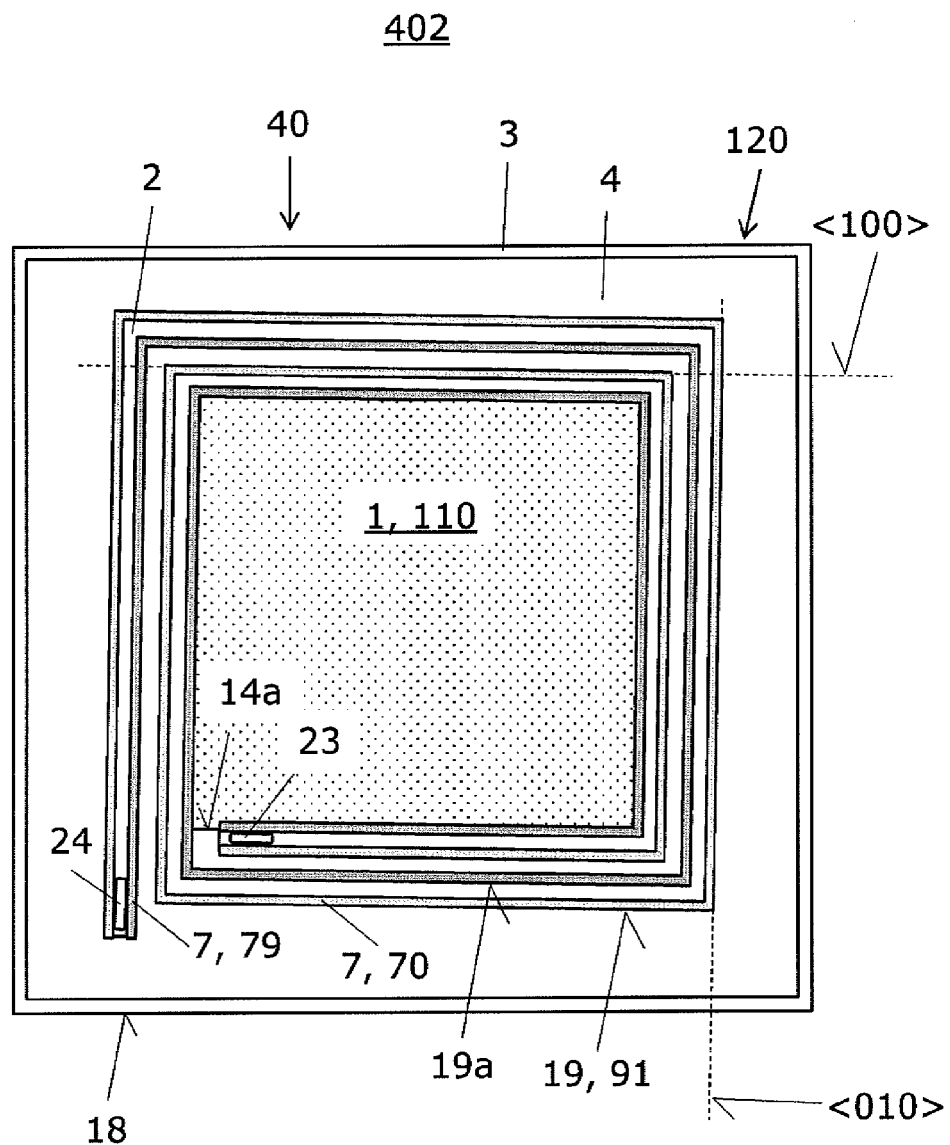
FIG. 14 schematically illustrates, in a plane view, a semiconductor device according to one or more embodiments.
Figure 15:
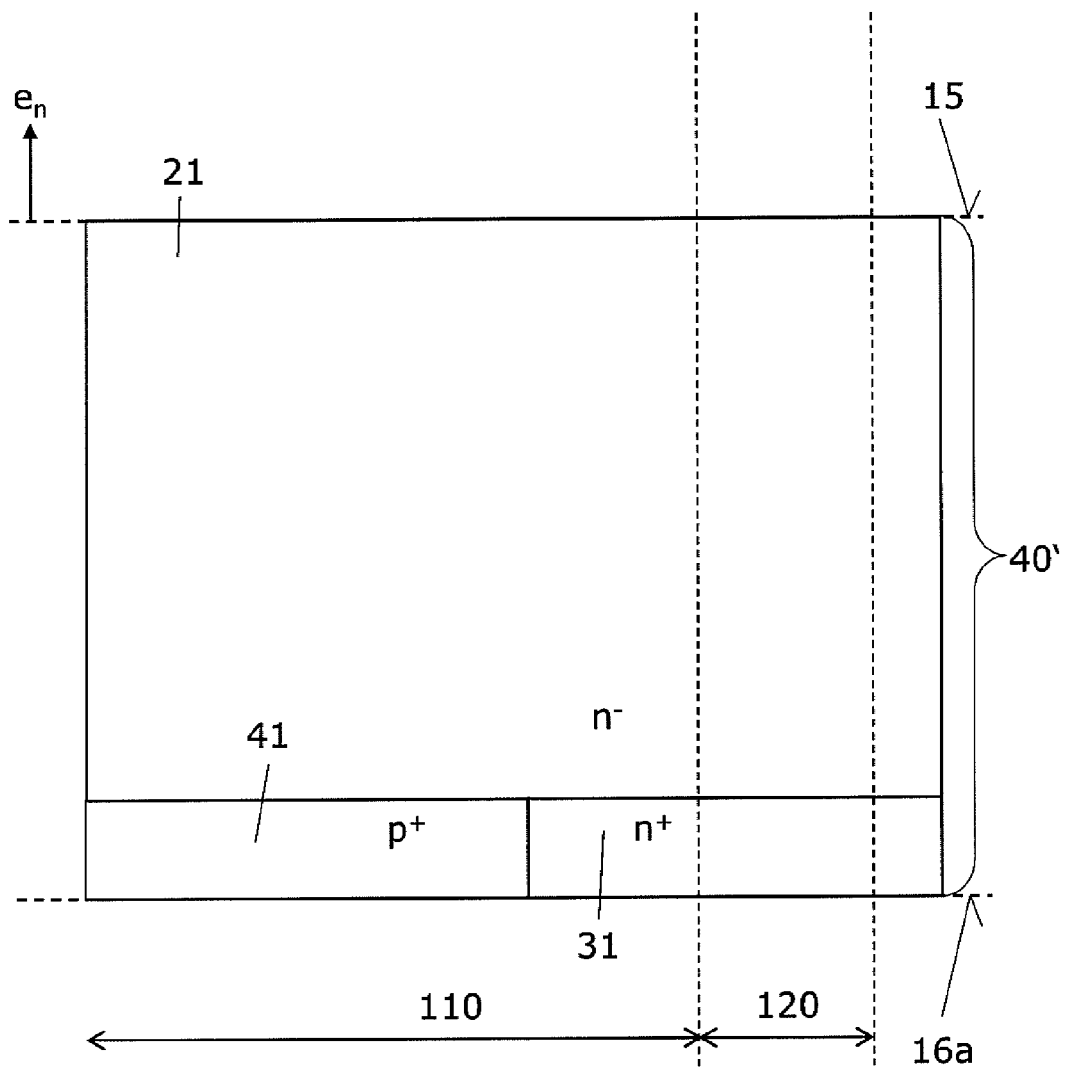
FIGS. 15-21 schematically illustrate, in vertical cross-sections, processes of manufacturing a semiconductor device according to one or more embodiments.

FIG. 14 schematically illustrates, in a plane view, a semiconductor device 402. Semiconductor device 402 shown in FIG. 14 is very similar to the exemplary embodiment described above with regard to FIGS. 11 and 12 and may also be operated as a TEDFET. However, the dielectric structure 7 includes, in the horizontal cross-section, instead of a hollow spiral a first dielectric spiral 70 and a second dielectric spiral 79 which winds around the first dielectric spiral 70. Due to the highly doped p-type contact region 23 for holes and the highly doped n-type contact region 24, discharge of holes and electrons generated during the blocking mode of semiconductor device 402 may be improved.

In some embodiments, two dielectric spirals that wind around each other may also be used as part of an edge termination structure instead of one dielectric spiral for the semiconductor devices explained above with regard to FIGS. 1 to 6.

With respect to FIGS. 15 to 21 methods for forming a semiconductor device 176 are illustrated in respective vertical cross-sections. These figures show vertical cross-sections through a semiconductor substrate 40' during or after particular method processes. In a first process, a semiconductor wafer 40' or semiconductor substrate 40', from which later individual dies are to be formed, is provided. An active area 110 and a peripheral area 120 are defined in the semiconductor substrate 40'. The first semiconductor wafer 101 may be made of any suitable semiconductor material such as Si or GaN or SiC. In the exemplary embodiment illustrated in FIG. 15, semiconductor substrate 40' includes an n-type layer 21 extending to a main horizontal surface 15. Furthermore, an $n^+$-type backside contact region 31 and a $p^+$-type backside contact region 41 are arranged below n-type layer 21 and extend to an opposite surface 16a. A portion of $p^+$-type backside contact region 41 typically later forms a collector region of an IGBT-structure. A portion of $n^+$-type backside contact region 31 arranged in an active area 110 typically forms a contact region of an integrated free-wheeling diode, whereas a further portion of $n^+$-type backside contact region 31 arranged in an peripheral area 120 typically forms a contact region of an edge termination structure. In embodiments in which a MOSFET is to be formed, $n^+$-type backside contact region 31 typically forms a continuous layer between n-type layer 21 and opposite surface 16a. In some embodiments, the $n^+$ and/or $p^+$ backside contact regions may be formed later in the process, e.g. after thinning the device.

Figure 16:
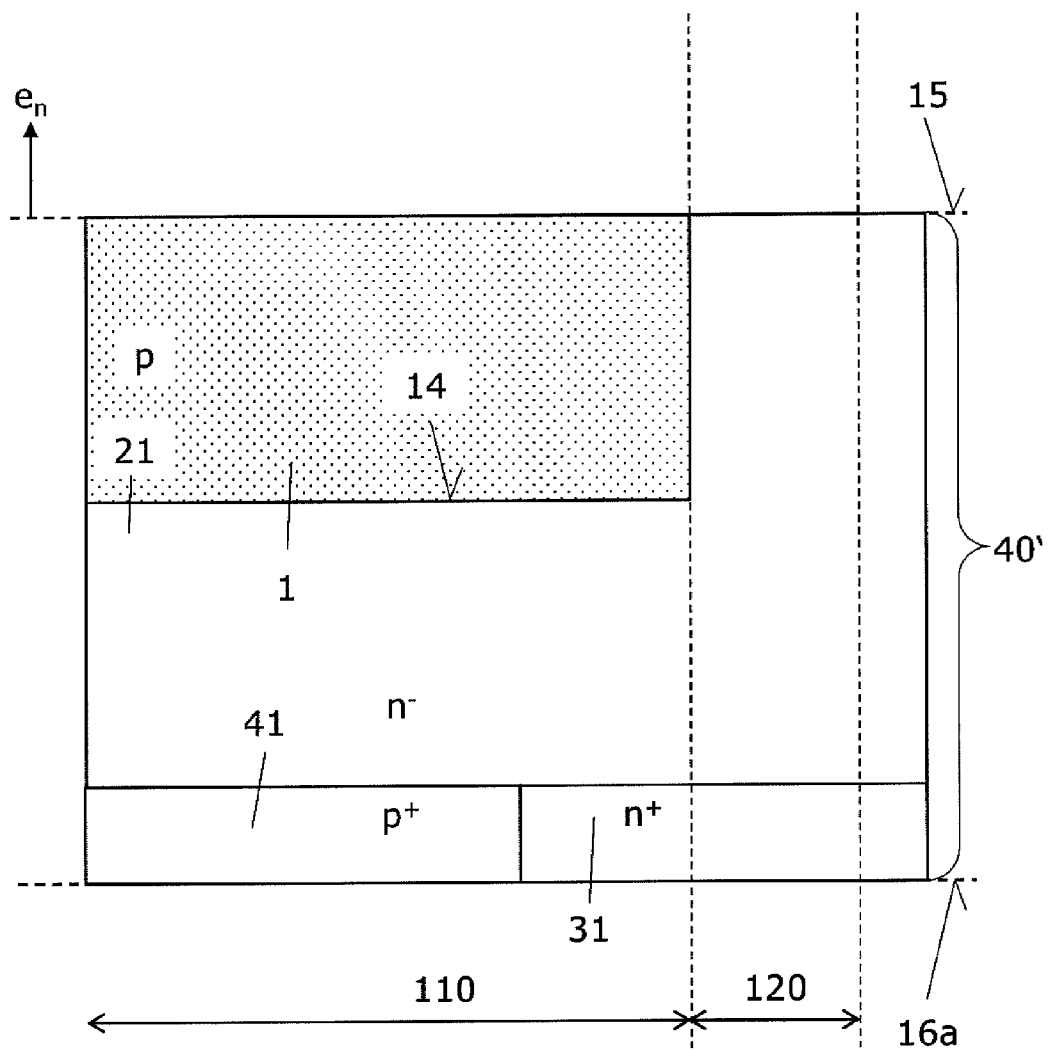

Thereafter, a pn-junction 14 is formed in semiconductor substrate 40'. This is typically done by forming a p-type semiconductor region 1 in n-type layer 21 from main horizontal surface 15, for example by implantation and subsequent drive-in processes. The resulting semiconductor structure 176 is illustrated in FIG. 16. A portion of the pn-junction 14 may, in another cross-section, extend to main horizontal surface 15.

Figure 17:
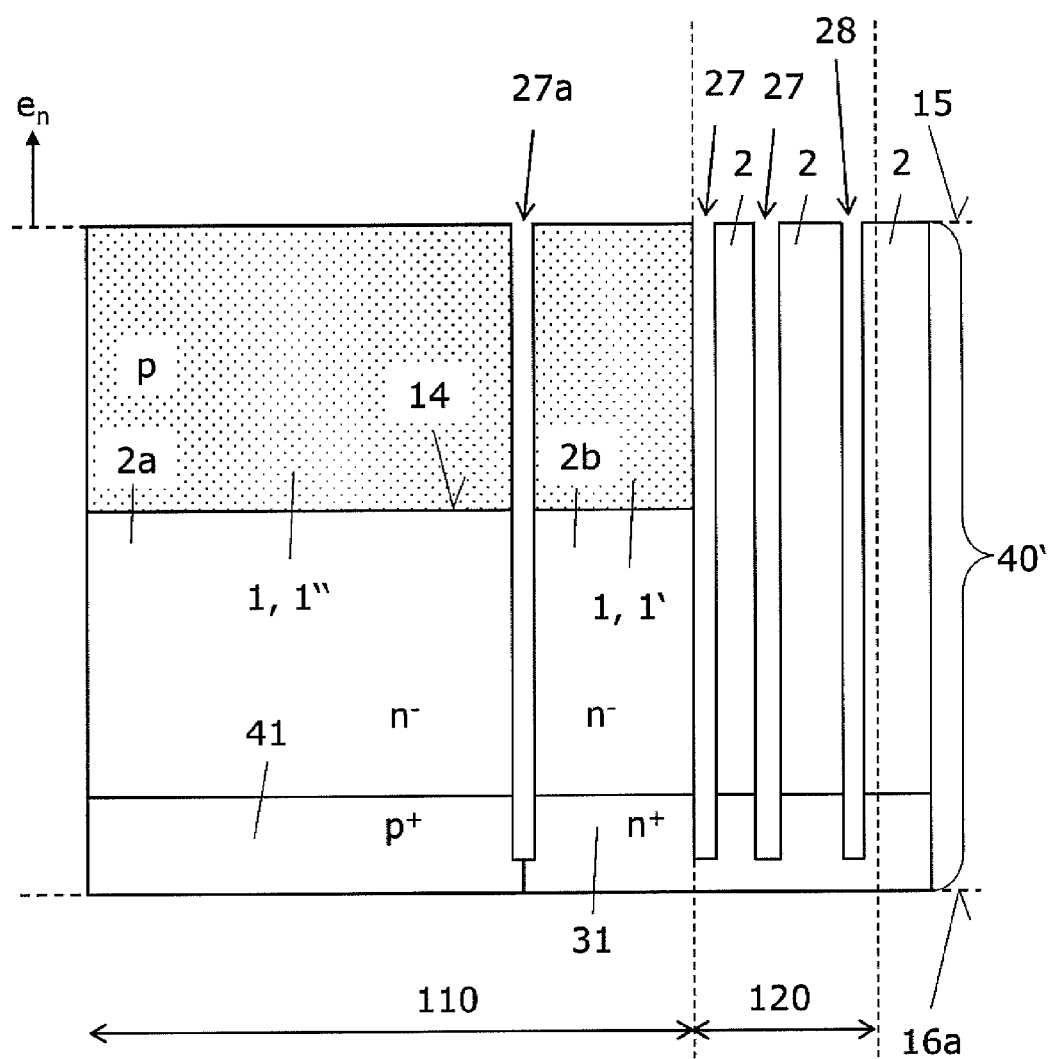

Thereafter, a vertical trench 27a is formed in the active area and one or more vertical trenches 27, 28 are formed in the peripheral area 120. In the following, vertical trench 27a is also referred to as inner vertical trench. The vertical trenches 27, 27a, 28 extend from the main horizontal surface 15 into the semiconductor substrate 40' and below the pn-junction 14. The resulting semiconductor structure 176 is illustrated in FIG. 17.

Vertical trenches 27, 27a, 28 may be formed in a common process, typically by etching using a mask, for example a $SiO_2$-mask. Typically, vertical trenches 27, 27a, 28 have substantially the same vertical depth. In the exemplary embodiment, vertical trenches 27, 27a, 28 extend completely through n-type layer 21. Vertical trench 27a of active area 110 extends through pn-junction 14 and partially into $n^+$-type backside contact region 31 and $p^+$-type backside contact region 41. Vertical trenches 27, 28 of peripheral area 120 extend partially into $n^+$-type backside contact region 31. Accordingly, the remaining n-type layer 21 is subdivided in two portions 2a and 2b in active area 110 and several mesas 2 in the peripheral area 120. Furthermore, the p-type semiconductor region 1 is typically subdivided into two portions 1', 1". Later, left portion 1" and the right portion 1' typically form a body region and an anode region, respectively. The width of trenches 27, 27a, 28 in the vertical cross-section may be equal and is typically larger than about 25 µm in case a power semiconductor device is formed.

Although different vertical trenches 27 are shown in vertical cross-sections, these trenches may be connected and formed in plane view as a spiral surrounding active area 110. An innermost segment of the spiral may, as illustrated in FIG. 17, adjoin p-type semiconductor region 1. Next to corner regions of active area 110, vertical trench 27 is in plane view substantially L-shaped. Vertical trench 28 is optional and may have a greater width than the vertical trenches 27, 27a. Typically, vertical trench 28 is formed in plane view as a circumferential trench.

Figure 18:
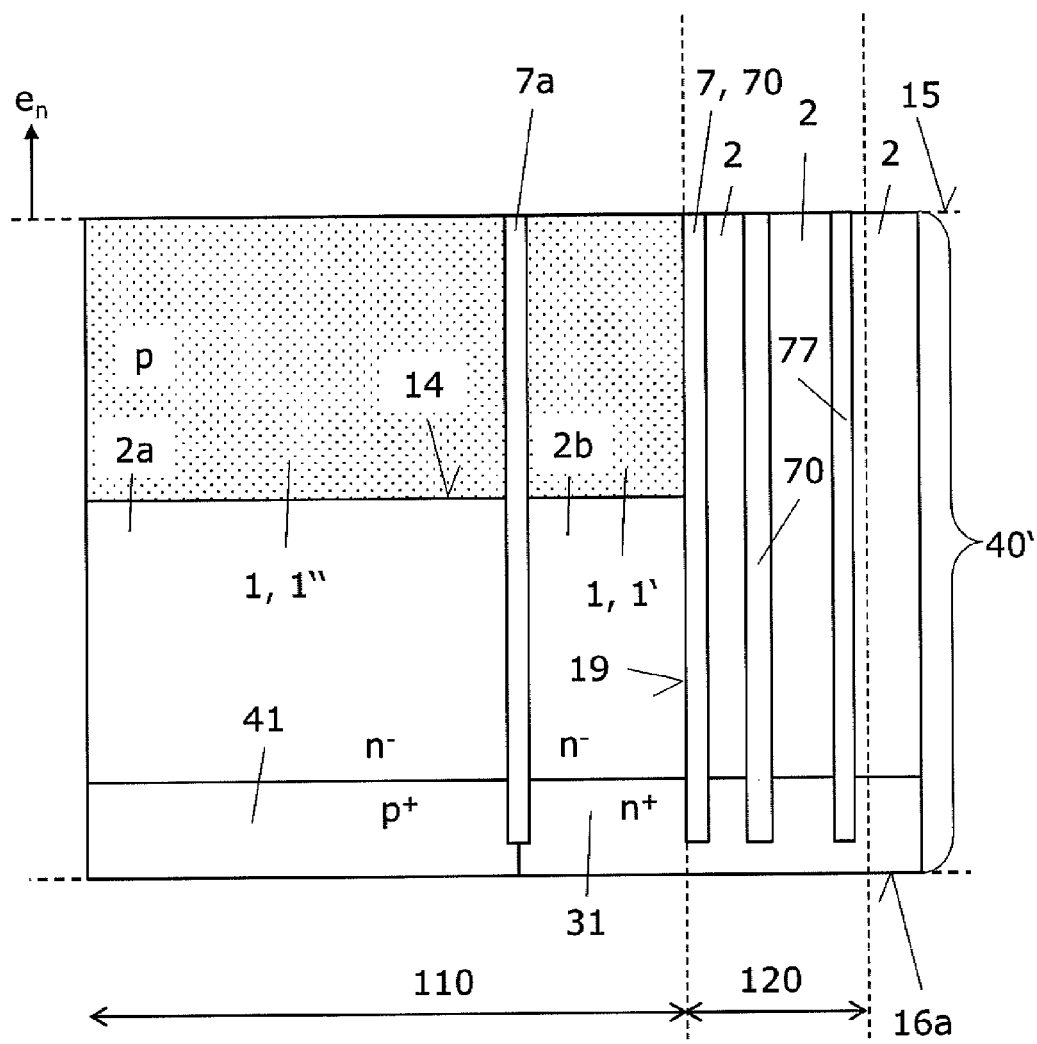

Thereafter, a dielectric region 70 is formed in the vertical trench 27, typically by thermal oxidation if the semiconductor substrate 40' is a silicon substrate. Dielectric region 70 may however also be formed by CVD-deposition and a planarization process or a back etching process. The mask typically used for forming vertical trenches 27, 27a, 28 may also be used to protect main horizontal surface 15 from being oxidized or as a stop region for a CMP-process. Vertical trench 27 is typically completely filled with dielectric region 70 forming, for example, a dielectric spiral in the peripheral area 120. Furthermore, a dielectric layer 7a and a dielectric ring 77 are formed in vertical trenches 27a and 28, respectively. The resulting semiconductor structure 176 is illustrated in FIG. 18. Dielectric layer 7a and dielectric ring 77 may be formed together with dielectric region 70.

In plane view and in a horizontal cross-section, dielectric region 70 typically surrounds the pn-junction 14 from all sides. Accordingly, a dielectric structure 7 is formed by dielectric region 70 that together with mesa regions 2 forms an edge termination structure of comparatively small horizontal extension at given blocking capability. Typically, dielectric region 70 is formed such that insulator-semiconductor interfaces 19 extend substantially along crystal planes of semiconductor substrate 40' to reduce entrapment of fixed negative charges. An angle between respective crystal planes and portions of the insulator-semiconductor interfaces 19 is typically less than about +/−15°, more typically of less than about +/−10°, and even more typically of less than about +/−5°.

Figure 19:
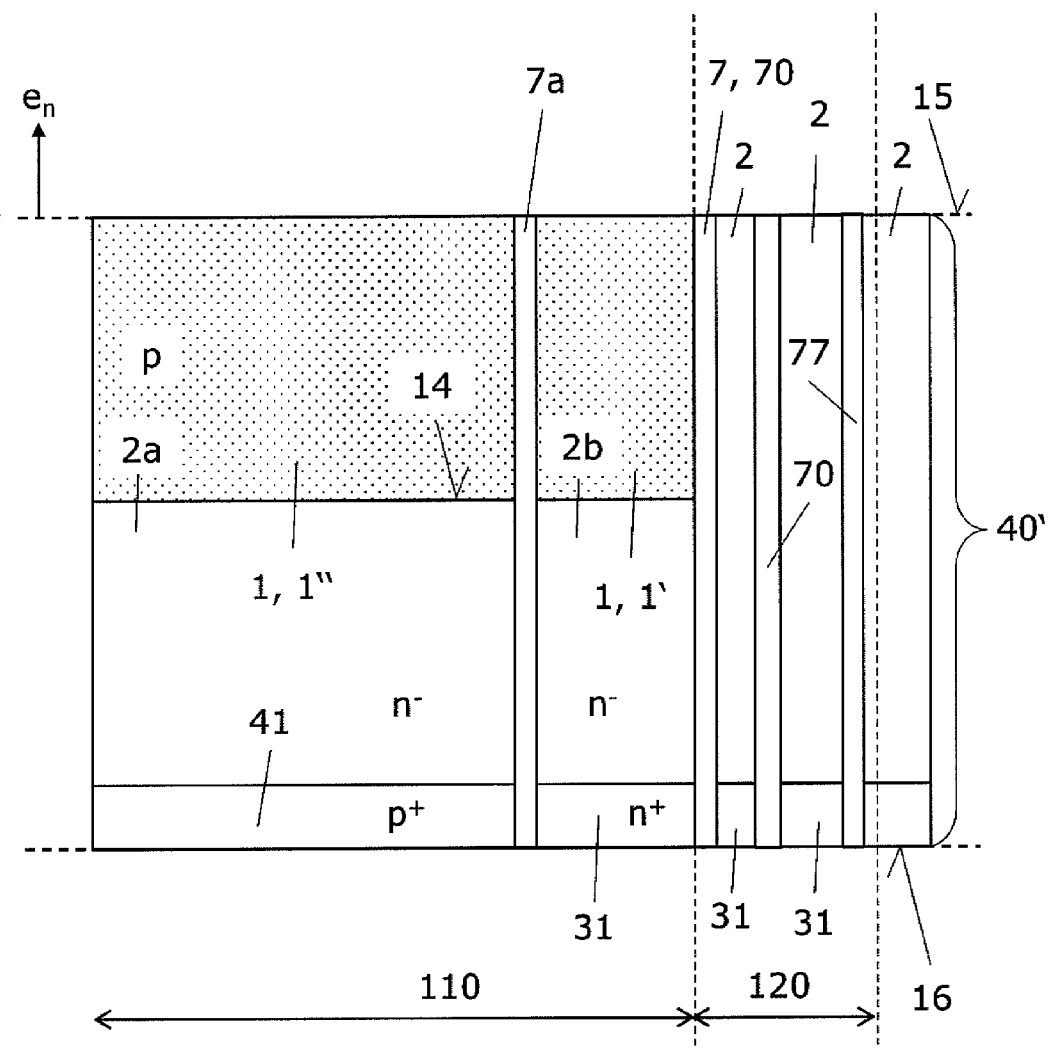

Thereafter, semiconductor substrate 40' is processed at opposite surface 16a to thin semiconductor substrate 40' to back-surface 16. This is may be done by polishing, etching, grinding, and/or a CMP process. Typically, dielectric region 70, dielectric layer 7a and/or dielectric ring 77 are used as stop-regions for thinning semiconductor substrate 40'. The resulting semiconductor structure 176 is illustrated in FIG. 19.

Figure 20:
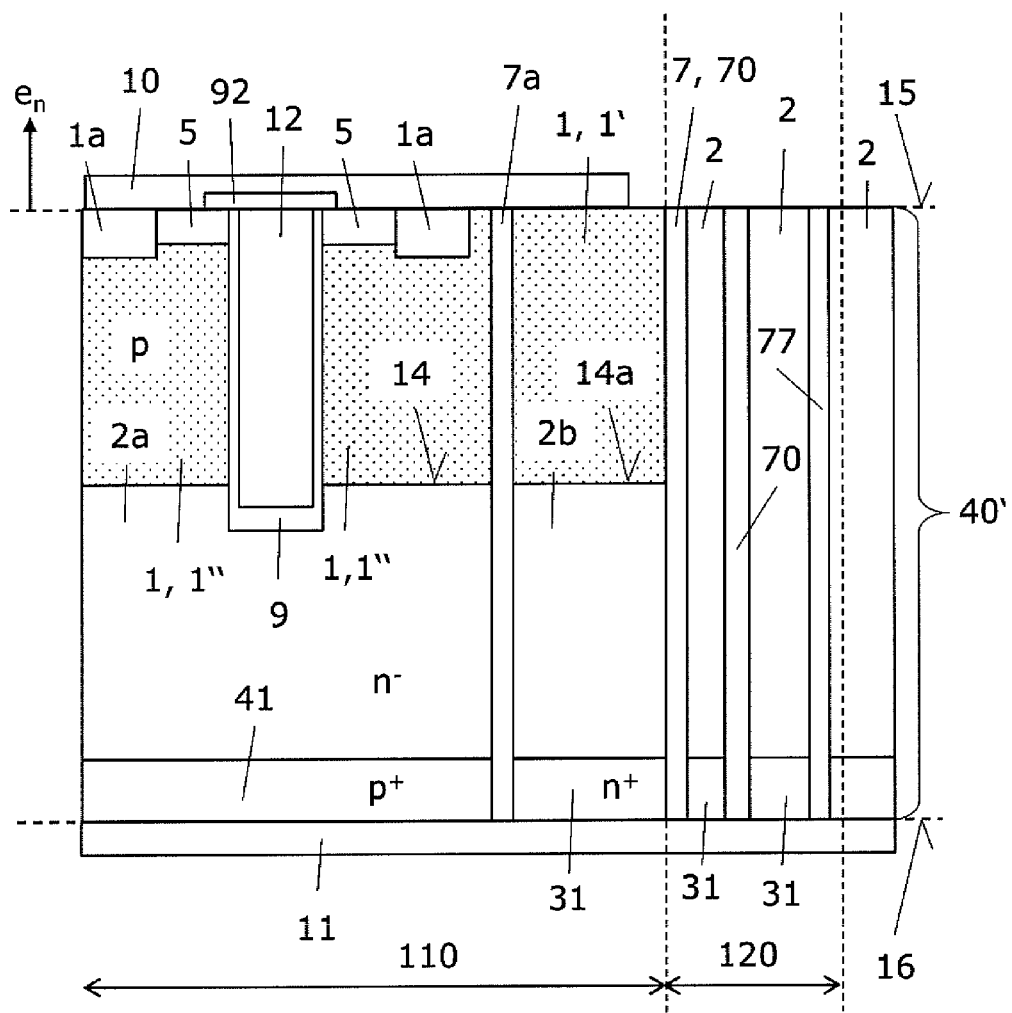

Thereafter, $n^+$-type source regions 5 and $p^+$-type body contact regions 1a are formed in a left portion of semiconductor region 1 forming a body region. An insulated gate electrode 12 is formed in a shallow trench which extends from main horizontal surface 15 through the body region. For example, a gate dielectric region 9 is formed at the walls of the shallow trench, typically as a thermal oxide. A poly-silicon is deposited and partly etched back to form gate electrode 12. A dielectric plug 92 is formed on gate electrode 12, for example by thermal oxidation. Thereafter, a first metallization 10 and a second metallization are formed on main horizontal surface 15 and back surface 16, respectively. The resulting semiconductor structure 176 is illustrated in FIG. 20. First metallization 10 is in ohmic contact with source regions 5, body contact regions 1a and the right portion of p-type semiconductor region 1 forming an anode region. Accordingly, first metallization forms a combined emitter metallization for an IGBT-structure and anode metallization for a diode structure. The second metallization 11 is in ohmic contact with the $p^+$-type backside contact region 41 forming a collector region of the IGBT-structure and the $n^+$-type backside contact region 31 forming cathode region of the diode structure and a contact region of the mesas 2, respectively.

Figure 21:
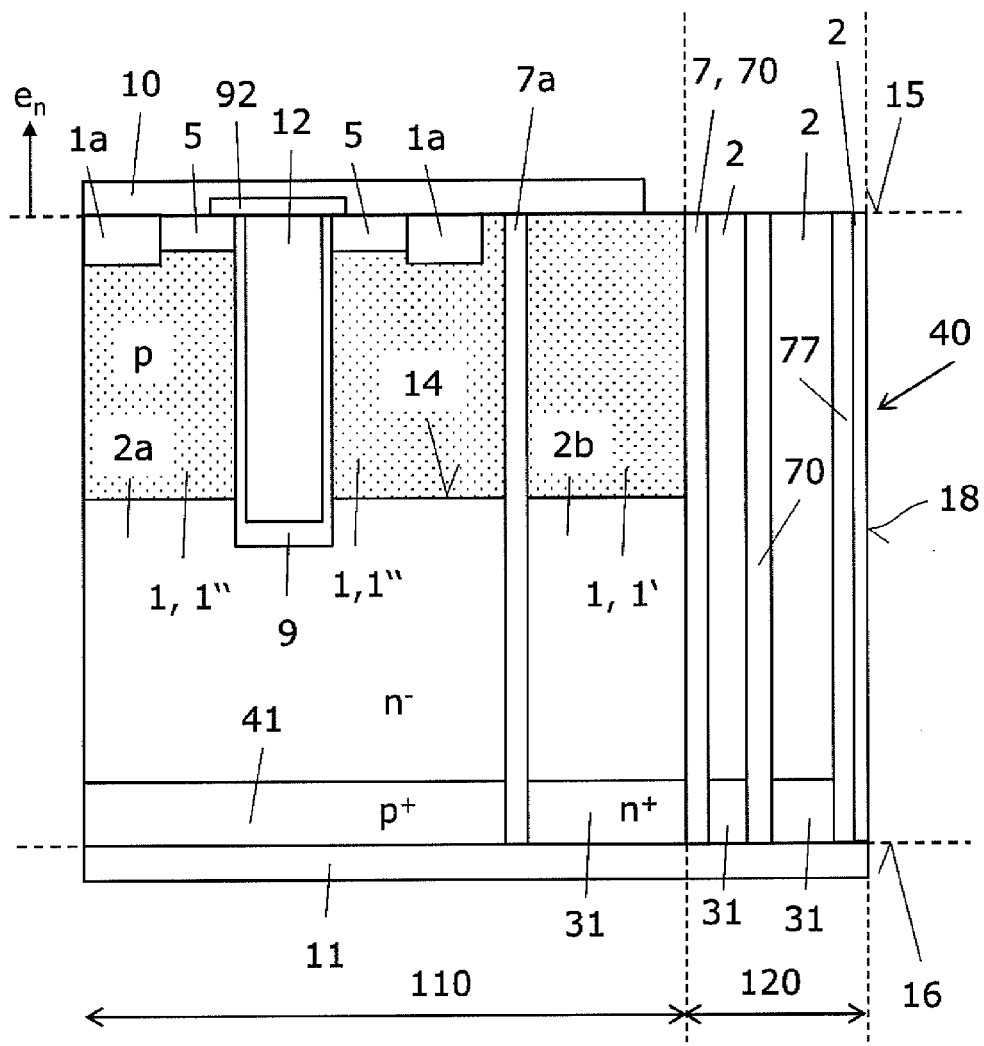
Figure 22:
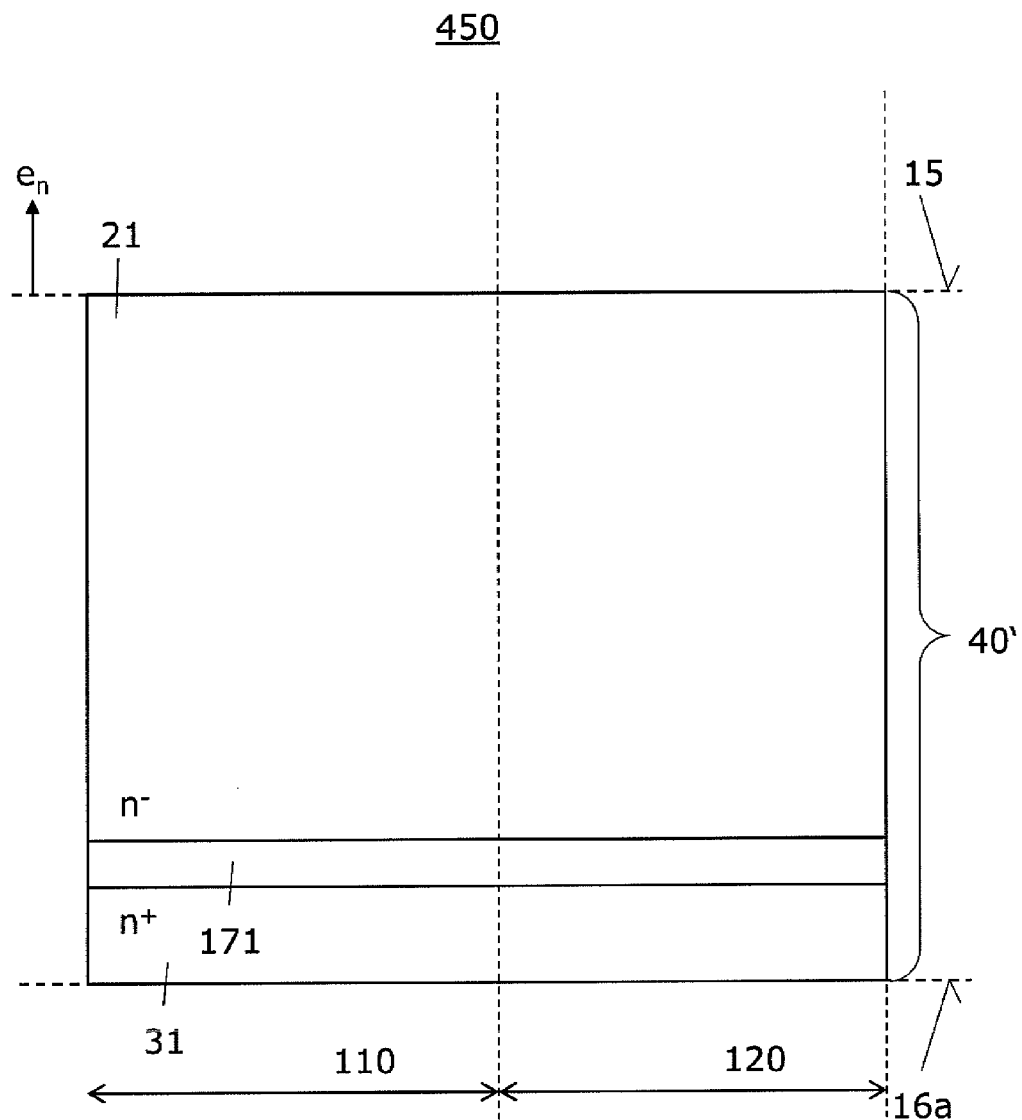
FIGS. 22-30 schematically illustrate, in vertical cross-sections, processes of manufacturing a semiconductor device according to one or more embodiments.

Thereafter, the semiconductor substrate 40' is divided to form separate dies 40 each of which extends to an outer edge 18. Typically, the semiconductor substrate is cut or sawed to form separate dies 40. According to an embodiment, dividing is performed such that the dielectric region 7 is inclined against outer edge 18, for example by 1° or more. The resulting semiconductor device 176 is illustrated in FIG. 21. Semiconductor device 176 is similar to the semiconductor device explained above with regard to FIG. 6 and may also be operated as an IBGT with integrated free-wheeling diode. However, semiconductor device 176 includes a field-stop region formed by dielectric ring 77 in the peripheral area 120.

With respect to FIGS. 22 to 30 methods for forming a semiconductor device 450 are illustrated in respective vertical cross-sections. In a first process a semiconductor substrate 40' is provided. In the exemplary embodiment shown in FIG. 22, semiconductor substrate 40' is an SOI-wafer (Silicon-On-Insulator) having a buried oxide layer 171 arranged between $n^-$-type semiconductor layer 21 extending to a main horizontal surface 15 and an $n^+$ type backside contact layer 31 extending to an opposite surface 16a. An active area 110 and a peripheral area 120 are defined in semiconductor substrate 40'.

Figure 23:
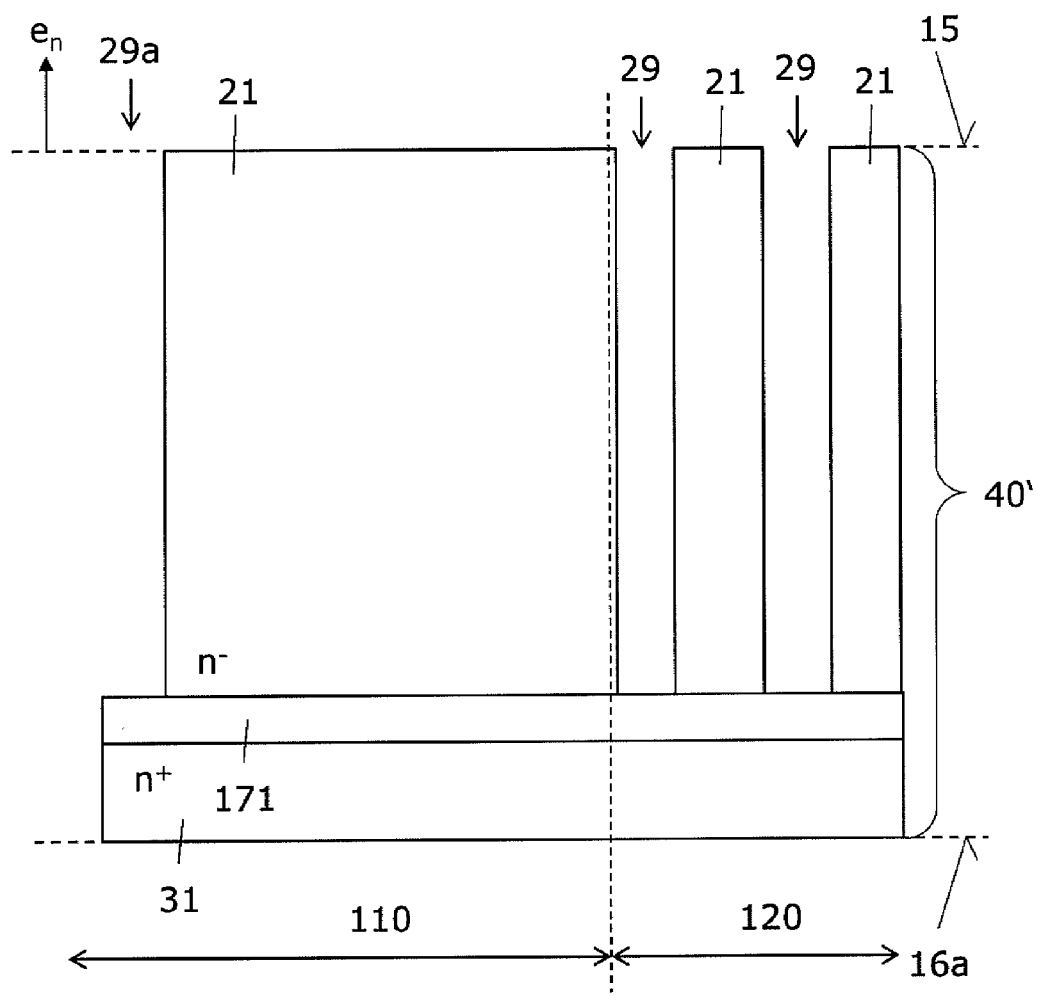

Thereafter, at least one vertical trench 29a and at least one vertical trench 29 are formed in active area 110 and peripheral area 120, respectively. This is typically done by masked etching using buried oxide layer 171 as an etch-stop. Small etching into the buried oxide layer 171 may take place but is not shown in FIG. 23. The resulting semiconductor structure 450 is illustrated in FIG. 23. Typically, vertical trenches 29, 29a have a respective width in the shown vertical cross-section of more than about 25 μm, more typically of more than about 50 μm and are therefore in the following also referred to as wide vertical trenches. For silicon, as a rule of thumb, the final active thickness of the device in μm is about the required blocking voltage in Volts divided by 10.

Figure 24:
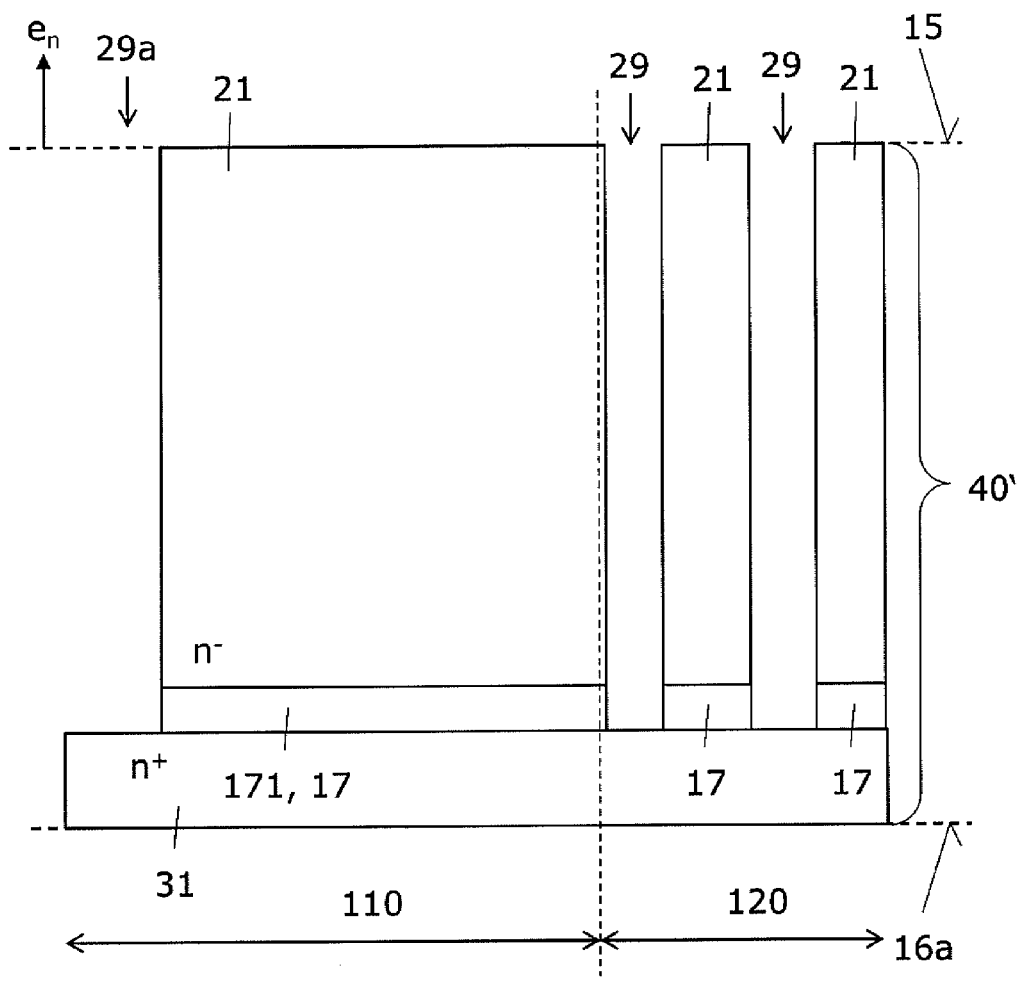

Thereafter, buried oxide layer 171 is etched through, typically by anisotropic oxide etching, to expose backside contact layer 31 in wide vertical trenches 29, 29a between remaining portions 17 of buried oxide layer 171. The resulting semiconductor structure 450 is illustrated in FIG. 24.

Figure 25:
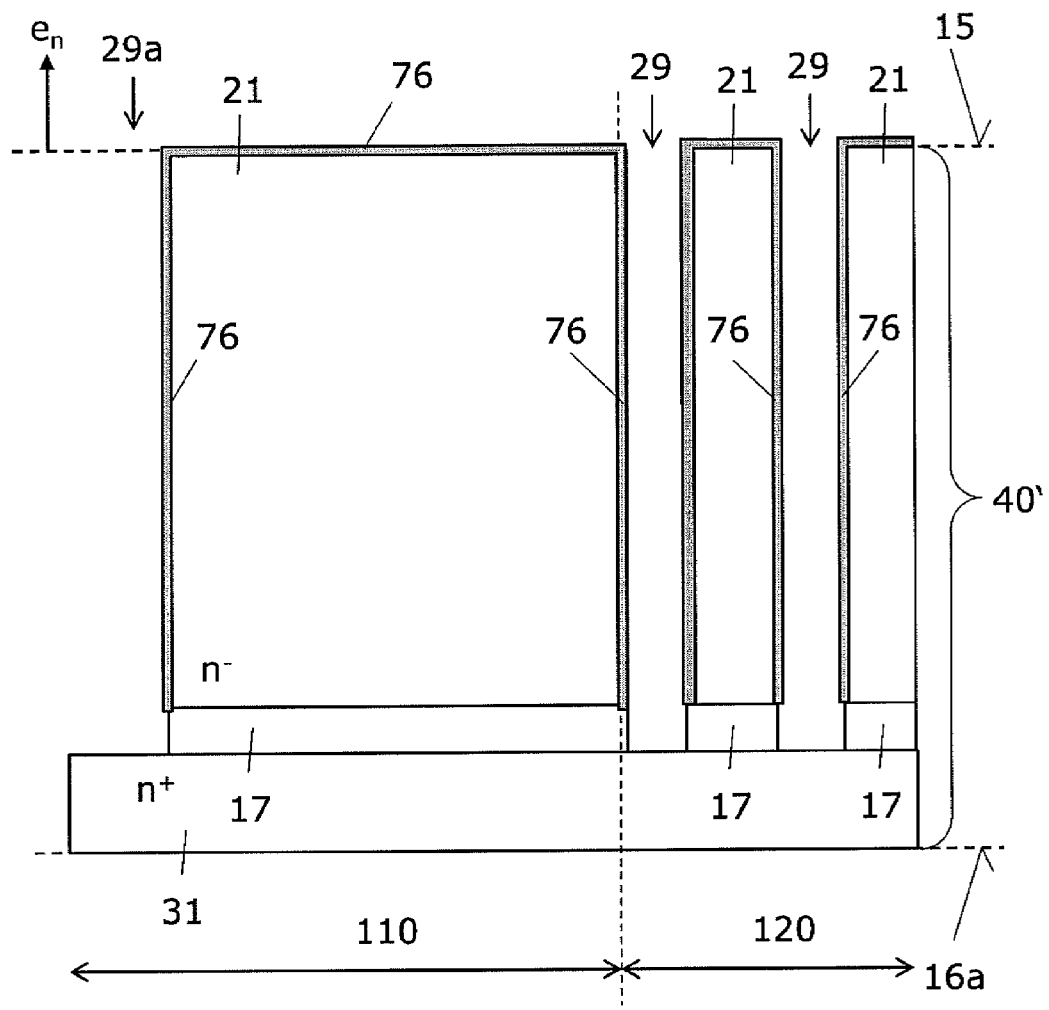

Thereafter, a sacrificial dielectric layer 76 is formed at the side walls of wide vertical trenches 29, 29a. This is typically done by thermal oxidation. The thermal oxide formed on backside contact layer 31 is removed, for example by anisotropic oxide etching. The sacrificial dielectric layer 76 formed on main horizontal surface 15 may at least partly remain there. The resulting semiconductor structure 450 is illustrated in FIG. 25.

Figure 26:
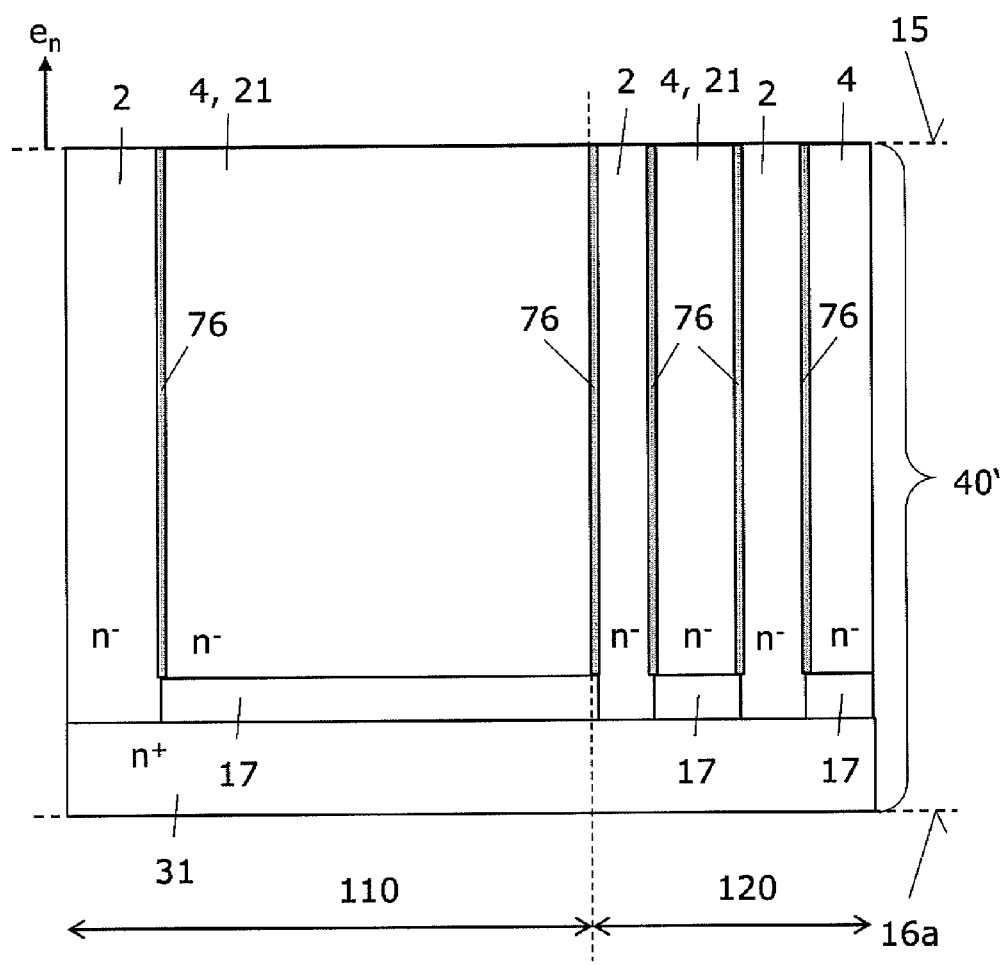

Thereafter, wide vertical trenches 29, 29a are filled with n-type semiconductor regions 2. This is typically done by selective epitaxy followed by processing the main horizontal surface 15. Accordingly, semiconductor regions 2 are formed as epitaxial filling in this embodiment. Processing may include polishing, etching, grinding, and/or a CMP process. Any remaining portion of the sacrificial dielectric layer 76 on main horizontal surface 15 may be used as a stop region for planarization. The resulting semiconductor structure 450 is illustrated in FIG. 26. Semiconductor regions 2 and remaining portions 4 of semiconductor layer 21 are in the following also referred to as mesa regions. Mesa regions 2 extend to backside contact layer 31 and are later typically contacted to a back metallization. Different thereto, mesa regions 4 are separated from backside contact layer 31 by remaining portion 17 of the buried oxide layer.

Figure 27:
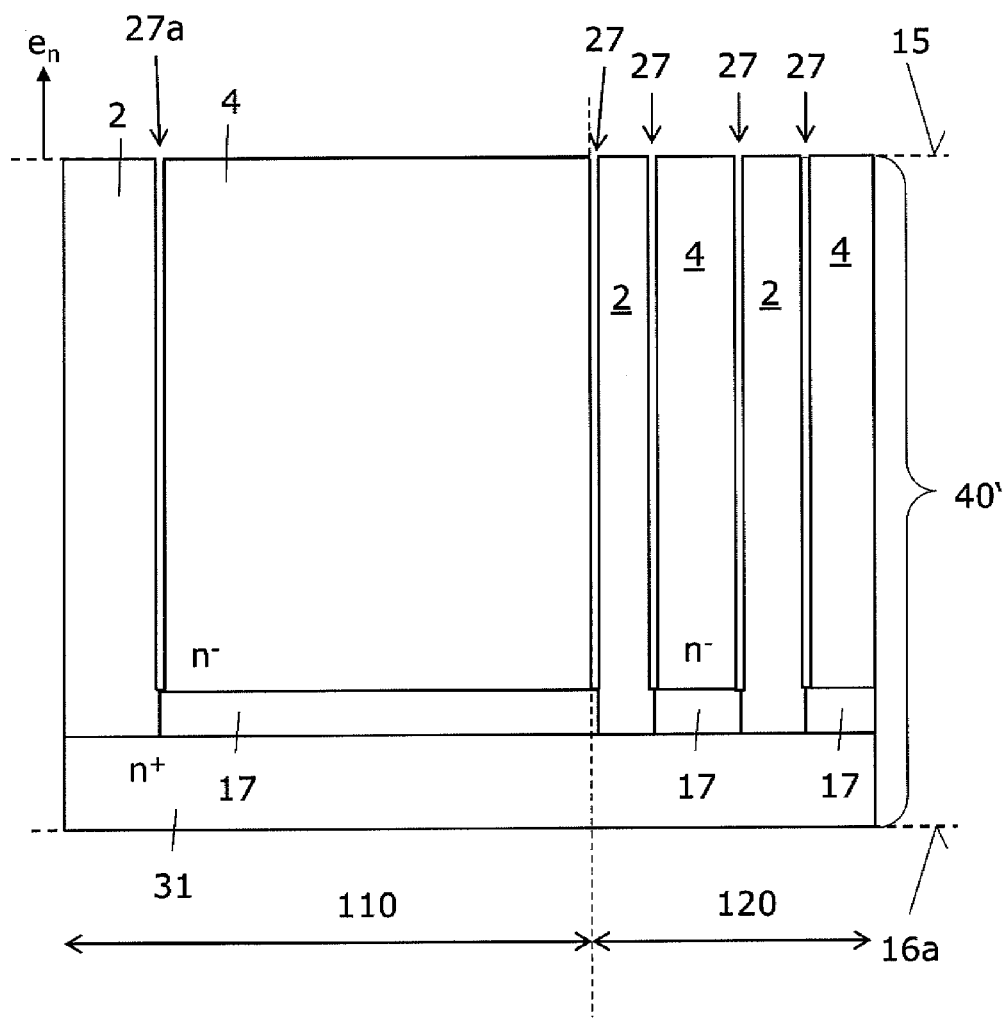

Thereafter, sacrificial dielectric layer 76 is typically removed. Removing sacrificial dielectric layer 76 may include a wet chemical etching using a solution containing hydrofluoric acid (HF). The resulting semiconductor structure 450 is illustrated in FIG. 27. Due to forming and removing sacrificial dielectric layer 76, any surface defects resulting from previous processes are typically removed. Accordingly, a better dielectric may be formed on the exposed sidewalls of formed vertical trenches 27, 27a. Vertical trenches 27, 27a have, in the vertical cross-section typically a much lower horizontal extension and a much higher aspect ratio than the wide vertical trenches.

Figure 28:
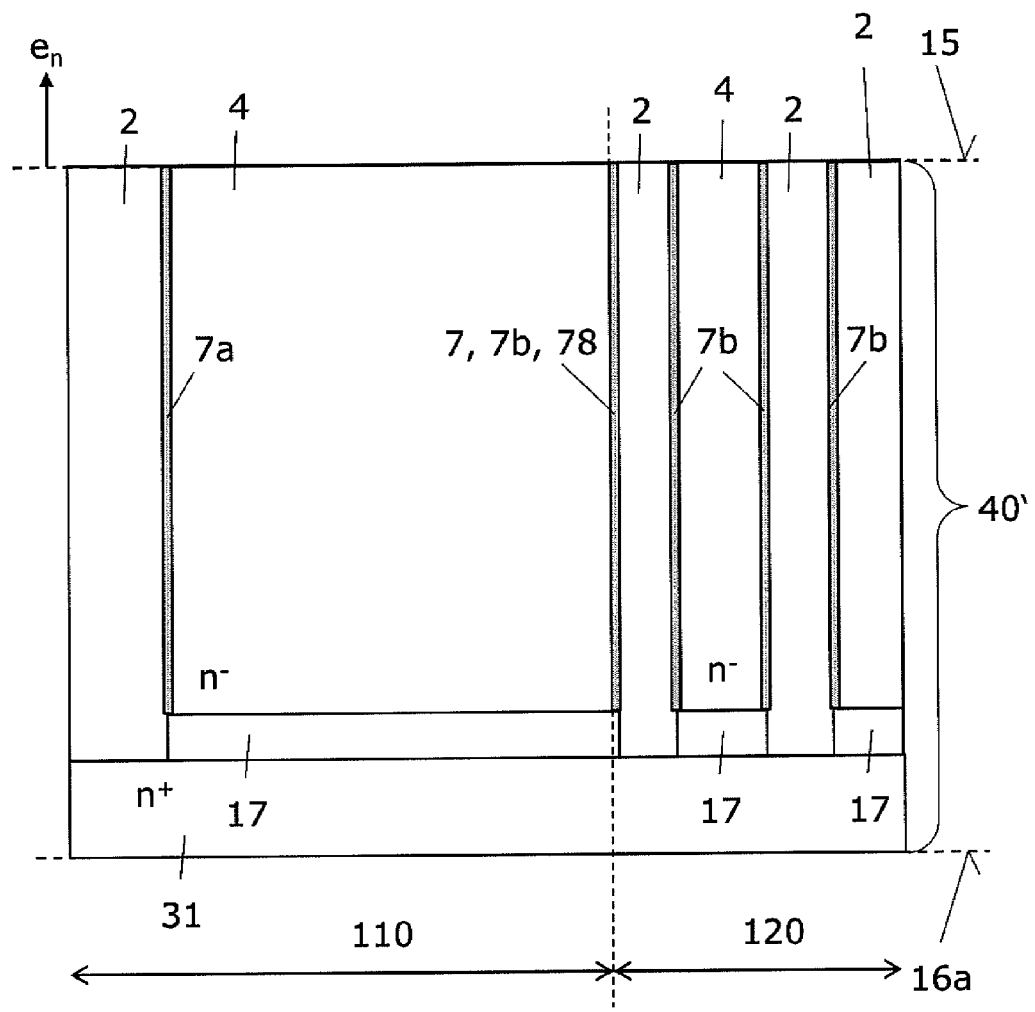

Thereafter, dielectric layers 7a and 7b are formed in vertical trenches 27a and 27, respectively. This is typically done by thermal oxidation. The resulting semiconductor structure 450 is illustrated in FIG. 28. Dielectric layer 7b is typically formed in plane view as a hollow spiral 78. The width of the mesa regions 2, 4 and dielectric layers 7b may be reduced and increased, respectively, by further cycles of removing dielectric layer 7b and thermal oxidizing of trench sidewalls while dielectric layer 7a is masked. In other words, dielectric layer 7b may also be used as a sacrificial dielectric layer. Accordingly, the width of dielectric layer 7a, i.e. the horizontal extension of dielectric layer 7a in the illustrated vertical cross-section, may be kept small, for example below 100 nm or even below 60 nm, and the final width of dielectric layers 7b may be increased to a value above about 200 nm, more typically about 500 nm. Accordingly, an edge termination structure with a dielectric structure 7 may be formed in the peripheral area 120, such that the thickness of dielectric layers 7b of dielectric structure 7 is sufficiently large and independently adjustable from the thickness of dielectric layer 7a in the active area 110. Dielectric layer 7a may, for example, be used to separate different semiconductor structures from each other, as explained above with reference to FIG. 6, and/or as a thin accumulation layer of a TEDFET as explained above with reference to FIG. 12.

Furthermore, the thickness of dielectric layers 7b may become lower with increasing distance from main horizontal surface 15. This may be achieved by appropriate etching scheme in vertical trenches of with aspect ratios above about 10 resulting in partial removal of semiconductor material in an upper portion of the vertical trench during removing the sacrificial dielectric layers 7a and/or 7b.

Figure 29:
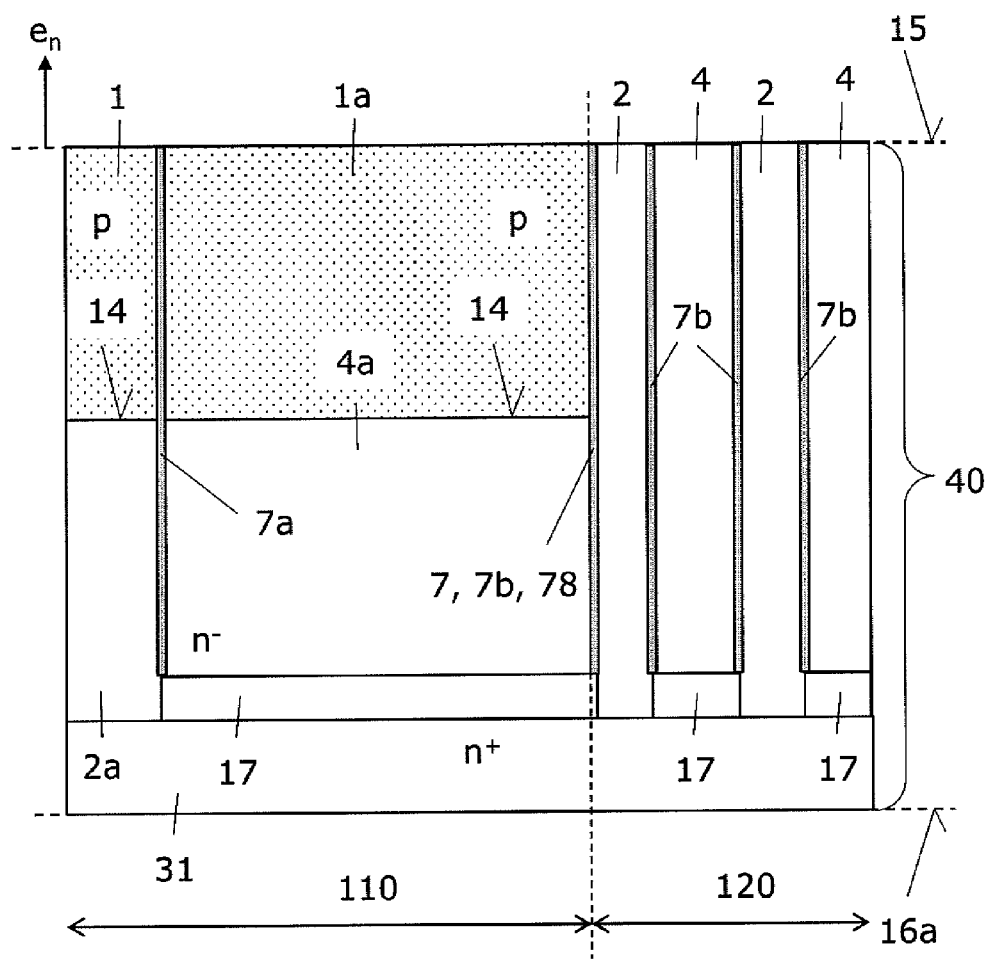

Thereafter, a pn-junction 14 is formed in mesa regions 2, 4 of active area 110. This is typically done by forming p-type semiconductor regions 1, 1a in active area 110 from main horizontal surface 15, respectively, for example by common implantation and subsequent drive-in processes. The resulting semiconductor structure 450 is illustrated in FIG. 29. Remaining portions of mesa region 2 and mesa region 4 of active area 110 form a drift region 2a and a drift control region 4a, respectively. Typically, semiconductor regions 1, 1a later form a body region and a connection region 1a of a TEDFET-structure.

Figure 30:
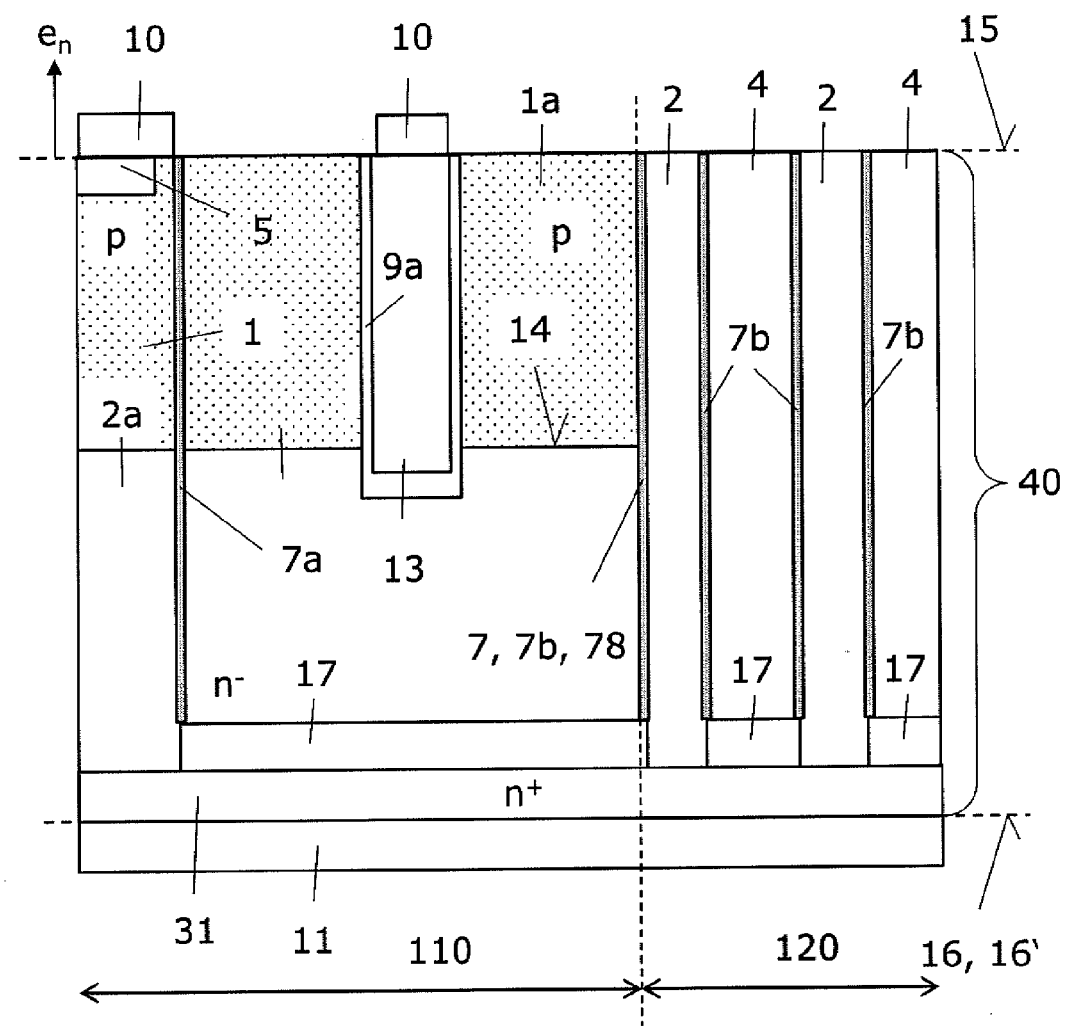

With regard to FIG. 30 further processes are explained. Body regions 5 and source regions (not shown in FIG. 30) are formed in semiconductor region 1, for example by implantation and subsequent drive-in processes. Furthermore, an insulated gate electrode (not shown in FIG. 30) and an insulated capacitor electrode 13 are formed such that they extend through p-type semiconductor region 1 and p-type semiconductor region 1a, respectively. Thereafter, a first metallization 10 is formed on main horizontal surface 15. First metallization 10 is in ohmic contact with body regions 5, source regions and insulated capacitor electrode 13. Optionally, backside contact region 31 may be thinned, for example using a CMP-process to a back surface 16. A second metallization 11 is formed opposite to first metallization 10. Thereafter, the semiconductor substrate is divided to form separate dies 40 which extend to an outer edge 18. Typically, the semiconductor substrate is cut or sawed to form separate dies 40. According to an embodiment, dividing is performed such that the dielectric region 7 is inclined against outer edge 18. Typically, first metallization 10 and second metallization 11 form a source metallization and a drain metallization, respectively. Accordingly, semiconductor device 450 may be operated as a TEDFET.

The manufacturing processes explained above with regard to FIGS. 15 to 21 and 22 to 30 have in common that a dielectric structure which extends from a main horizontal surface into a semiconductor substrate is formed in a peripheral area defined in a semiconductor substrate. The dielectric structure is formed such that it surrounds an active area and includes, in a horizontal cross-section, substantially L-shaped portions which are arranged next to corner regions of the active area. An outer edge is formed, for example by cutting the semiconductor substrate into different dies, so that the substantially L-shaped portions are, in the horizontal cross-section, inclined against the outer edge. Accordingly, a semiconductor device, typically a power semiconductor device, with an edge termination of low space requirements is formed.

The written description above uses specific embodiments to disclose the aspects of the application, including the best mode, and also to enable any person skilled in the art to make and use these aspects. While the invention has been described in terms of various specific embodiments, those skilled in the art will recognize that the invention can be practiced with modification within the spirit and scope of the claims. Especially, mutually non-exclusive features of the embodiments described above may be combined with each other. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A semiconductor device, comprising:
   a semiconductor die comprising an outer edge and an active area defining a main horizontal surface and being spaced apart from the outer edge; and
   an edge termination structure comprising a dielectric structure formed as a dielectric spiral which surrounds the active area and extends from the main horizontal surface into the semiconductor die, the dielectric structure forming a semiconductor-insulator interface with the semiconductor die which is inclined against the outer edge,
   wherein the dielectric spiral winds at least two times around the active area,
   wherein in a horizontal cross-section, an acute angle ranging from about 1° to about 20° is formed between substantially straight portions of the semiconductor-insulator interface and substantially straight portions of the outer edge.

2. The semiconductor device of claim 1, wherein the dielectric structure comprises at least one vertical trench having at least two portions which are, in the horizontal cross-section, arranged at an angle of about 90° with respect to one another.

3. The semiconductor device of claim 1, wherein the edge termination structure comprises a plurality of vertical trenches which are arranged around the active area.

4. The semiconductor device of claim 1, wherein the edge termination structure further comprises a closed vertical trench arranged around the at least one vertical trench.

5. The semiconductor device of claim 1, wherein the active area is surrounded by an outer n-type semiconductor region of the semiconductor die and the active area includes a p-type semiconductor region which forms a pn-junction within the semiconductor die, and wherein a portion of the pn-junction extends to the main horizontal surface next to the outer n-type semiconductor region so that the active area is surrounded by the dielectric spiral but not insulated from the outer n-type semiconductor region.

6. The semiconductor device of claim 1, wherein the dielectric spiral winds at least 5 times around the active area.

7. The semiconductor device of claim 1, wherein the dielectric spiral winds at least 10 times around the active area.

* * * * *

UNITED STATES PATENT AND TRADEMARK OFFICE
CERTIFICATE OF CORRECTION

| | | |
|---|---|---|
| PATENT NO. | : 8,981,520 B2 | Page 1 of 1 |
| APPLICATION NO. | : 13/972602 | |
| DATED | : March 17, 2015 | |
| INVENTOR(S) | : F. Hirler et al. | |

It is certified that error appears in the above-identified patent and that said Letters Patent is hereby corrected as shown below:

In the Claims

At column 22, line 51 (claim 4) of the printed patent, please delete "the" before at.

Signed and Sealed this
Eighteenth Day of August, 2015

Michelle K. Lee
*Director of the United States Patent and Trademark Office*